US009842875B2

(12) United States Patent
Fan et al.

(10) Patent No.: US 9,842,875 B2
(45) Date of Patent: Dec. 12, 2017

(54) IMAGE SENSOR WITH BURIED LIGHT SHIELD AND VERTICAL GATE

(71) Applicant: Apple Inc., Cupertino, CA (US)

(72) Inventors: Xiaofeng Fan, Cupertino, CA (US);
Philip H. Li, Cupertino, CA (US);
Chung Chun Wan, Fremont, CA (US);
Anup K. Sharma, Cupertino, CA (US);
Xiangli Li, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/161,179

(22) Filed: May 20, 2016

(65) Prior Publication Data
US 2016/0343756 A1 Nov. 24, 2016

Related U.S. Application Data

(63) Continuation of application No. 13/959,362, filed on Aug. 5, 2013, now Pat. No. 9,356,061.

(51) Int. Cl.
*H01L 27/146* (2006.01)

(52) U.S. Cl.
CPC .... *H01L 27/14623* (2013.01); *H01L 27/1462* (2013.01); *H01L 27/1464* (2013.01); *H01L 27/14625* (2013.01); *H01L 27/14638* (2013.01); *H01L 27/14685* (2013.01)

(58) Field of Classification Search
None
See application file for complete search history.

(56) References Cited

U.S. PATENT DOCUMENTS

| 3,363,104 | A | 1/1968 | Waite et al. |
| 3,761,947 | A | 9/1973 | Volkmann et al. |
| 4,620,222 | A | 10/1986 | Baba et al. |
| 4,691,366 | A | 9/1987 | Fenster et al. |

(Continued)

FOREIGN PATENT DOCUMENTS

| CN | 1663039 | 8/2005 |
| CN | 102983143 | 3/2013 |

(Continued)

OTHER PUBLICATIONS

Author Unknown, "YCbCr," http://en.wikipedia.org/wiki/Y%27CbCr, 4 pages, at least as early as Jun. 17, 2010.

(Continued)

*Primary Examiner* — Michelle Mandala
(74) *Attorney, Agent, or Firm* — Brownstein Hyatt Farber Schreck, LLP

(57) ABSTRACT

A pixel in an image sensor can include a photodetector and a storage region disposed in one substrate, or a photodetector disposed in one substrate and a storage region in another substrate. A buried light shield is disposed between the photodetector and the storage region. A sense region, such as a floating diffusion, can be adjacent to the storage region, with the buried light shield disposed between the photodetector and the storage and sense regions. When the photodetector and the storage region are disposed in separate substrates, a vertical gate can be formed through the buried light shield and used to initiate the transfer of charge from the photodetector and the storage region. A transfer channel formed adjacent to, or around the vertical gate provides a channel for the charge to transfer from the photodetector to the storage region.

20 Claims, 21 Drawing Sheets

(56) References Cited

U.S. PATENT DOCUMENTS

| | | |
|---|---|---|
| 4,823,194 A | 4/1989 | Mishima et al. |
| 4,992,666 A | 2/1991 | Robertson |
| 5,086,478 A | 2/1992 | Kelly-Mahaffey et al. |
| 5,272,473 A | 12/1993 | Thompson et al. |
| 5,274,494 A | 12/1993 | Rafanelli et al. |
| 5,283,640 A | 2/1994 | Tilton |
| 5,337,081 A | 8/1994 | Kamiya et al. |
| 5,625,408 A | 4/1997 | Matsugu et al. |
| 5,748,199 A | 5/1998 | Palm |
| 5,757,423 A | 5/1998 | Tanaka et al. |
| 6,002,423 A | 12/1999 | Rappaport et al. |
| 6,043,838 A | 3/2000 | Chen |
| 6,215,898 B1 | 4/2001 | Woodfill et al. |
| 6,282,655 B1 | 8/2001 | Given |
| 6,310,662 B1 | 10/2001 | Sunakawa et al. |
| 6,339,429 B1 | 1/2002 | Schug |
| 6,389,153 B1 | 5/2002 | Imai et al. |
| 6,416,186 B1 | 7/2002 | Nakamura |
| 6,421,118 B1 | 7/2002 | Shaar |
| 6,456,339 B1 | 9/2002 | Surati et al. |
| 6,516,151 B2 | 2/2003 | Pilu |
| 6,525,772 B2 | 2/2003 | Johnson et al. |
| 6,560,711 B1 | 5/2003 | Given et al. |
| 6,561,654 B2 | 5/2003 | Mukawa et al. |
| 6,614,471 B1 | 9/2003 | Ott |
| 6,618,076 B1 | 9/2003 | Sukthankar et al. |
| 6,636,292 B2 | 10/2003 | Roddy et al. |
| 6,807,010 B2 | 10/2004 | Kowarz |
| 6,862,022 B2 | 3/2005 | Slupe |
| 6,862,035 B2 | 3/2005 | Jeong et al. |
| 6,877,863 B2 | 4/2005 | Wood et al. |
| 6,903,880 B2 | 6/2005 | Beatson et al. |
| 6,921,172 B2 | 7/2005 | Ulichney et al. |
| 6,924,909 B2 | 8/2005 | Lee et al. |
| 6,930,669 B2 | 8/2005 | Weiner et al. |
| 6,931,601 B2 | 8/2005 | Vronay et al. |
| 6,970,080 B1 | 11/2005 | Crouch et al. |
| 7,028,269 B1 | 4/2006 | Cohen-Solal et al. |
| 7,058,234 B2 | 6/2006 | Gindele et al. |
| 7,079,707 B2 | 7/2006 | Baron |
| 7,103,212 B2 | 9/2006 | Hager et al. |
| 7,123,292 B1 | 10/2006 | Seeger et al. |
| 7,123,298 B2 | 10/2006 | Schroeder et al. |
| 7,307,709 B2 | 12/2007 | Lin et al. |
| 7,324,681 B2 | 1/2008 | Chang et al. |
| 7,330,584 B2 | 2/2008 | Weiguo et al. |
| 7,352,913 B2 | 4/2008 | Karuta et al. |
| 7,370,336 B2 | 5/2008 | Husain et al. |
| 7,413,311 B2 | 8/2008 | Govorkov et al. |
| 7,453,510 B2 | 11/2008 | Kolehmainen et al. |
| 7,460,179 B2 | 12/2008 | Pate et al. |
| 7,483,065 B2 | 1/2009 | Gruhlke et al. |
| 7,512,262 B2 | 3/2009 | Criminisi et al. |
| 7,551,771 B2 | 6/2009 | England |
| 7,561,731 B2 | 7/2009 | Wallace et al. |
| 7,567,271 B2 | 7/2009 | Berestov |
| 7,570,881 B2 | 8/2009 | Perala et al. |
| 7,590,335 B2 | 9/2009 | Kobayashi et al. |
| 7,590,992 B2 | 9/2009 | Koplar et al. |
| 7,594,319 B2 | 9/2009 | Nakamura et al. |
| 7,598,980 B2 | 10/2009 | Imai et al. |
| 7,613,389 B2 | 11/2009 | Suzuki et al. |
| 7,629,897 B2 | 12/2009 | Koljonen |
| 7,641,348 B2 | 1/2010 | Yin et al. |
| 7,643,025 B2 | 1/2010 | Lange |
| 7,653,304 B2 | 1/2010 | Nozaki et al. |
| 7,658,498 B2 | 2/2010 | Anson |
| 7,671,435 B2 | 3/2010 | Ahn |
| 7,834,846 B1 | 11/2010 | Bell |
| 7,869,204 B2 | 1/2011 | Bair et al. |
| 7,881,603 B2 | 2/2011 | Gere et al. |
| 7,901,084 B2 | 3/2011 | Willey et al. |
| 7,925,077 B2 | 4/2011 | Woodfill et al. |
| 7,964,835 B2 | 6/2011 | Olsen et al. |
| 7,965,329 B2 | 6/2011 | McCarten et al. |
| 8,044,880 B2 | 10/2011 | Nakamura et al. |
| 8,094,195 B2 | 1/2012 | Butterworth |
| 8,139,059 B2 | 3/2012 | Trepte |
| 8,147,731 B2 | 4/2012 | Nimmakayala et al. |
| 8,155,432 B2 | 4/2012 | Ueno |
| 8,218,486 B2 | 7/2012 | Jung et al. |
| 8,319,822 B2 | 11/2012 | McClatchie |
| 8,334,893 B2 | 12/2012 | Hartman |
| 8,339,494 B1 | 12/2012 | McCarten |
| 8,405,727 B2 | 3/2013 | Gere |
| 8,411,931 B2 | 4/2013 | Zhou et al. |
| 8,452,077 B2 | 5/2013 | Ravid et al. |
| 8,456,518 B2 | 6/2013 | Pace et al. |
| 8,487,259 B2 | 7/2013 | Cho et al. |
| 8,497,897 B2 | 7/2013 | Gere |
| 8,508,671 B2 | 8/2013 | Slack et al. |
| 8,527,908 B2 | 9/2013 | Pance et al. |
| 8,538,084 B2 | 9/2013 | Slack et al. |
| 8,538,132 B2 | 9/2013 | Kessler et al. |
| 8,610,726 B2 | 12/2013 | Pance et al. |
| 8,619,128 B2 | 12/2013 | Bilbrey et al. |
| 8,659,548 B2 | 2/2014 | Hildreth |
| 8,681,216 B2 | 3/2014 | Atkinson |
| 8,687,070 B2 | 4/2014 | Chen et al. |
| 8,745,541 B2 | 6/2014 | Wilson et al. |
| 8,749,635 B2 | 6/2014 | Hogasten et al. |
| 8,761,596 B2 | 6/2014 | Gere et al. |
| 8,809,922 B2 | 8/2014 | Moriya et al. |
| 8,824,833 B2 | 9/2014 | Dagher et al. |
| 8,941,198 B2 | 1/2015 | Enomoto |
| 8,987,852 B2 | 3/2015 | Okabe et al. |
| 9,030,462 B2 | 5/2015 | McDaniel |
| 9,058,081 B2 | 6/2015 | Baxter |
| 9,136,304 B2 | 9/2015 | Maeda |
| 9,232,162 B2 | 1/2016 | Lenchenkov et al. |
| 9,294,691 B2 | 3/2016 | Ooki |
| 9,343,494 B2 | 5/2016 | Lee et al. |
| 9,356,061 B2 | 5/2016 | Fan et al. |
| 9,478,030 B1 | 10/2016 | Lecky |
| 2002/0021288 A1 | 2/2002 | Schug |
| 2003/0038927 A1 | 2/2003 | Alden |
| 2003/0086013 A1 | 5/2003 | Aratani |
| 2003/0117343 A1 | 6/2003 | Kling |
| 2004/0119988 A1 | 6/2004 | Chen et al. |
| 2004/0189796 A1 | 9/2004 | Ho et al. |
| 2005/0132408 A1 | 6/2005 | Dahley et al. |
| 2005/0146634 A1 | 7/2005 | Silverstein et al. |
| 2005/0168583 A1 | 8/2005 | Thomason |
| 2005/0182962 A1 | 8/2005 | Given et al. |
| 2005/0237385 A1 | 10/2005 | Kosaka |
| 2005/0280786 A1 | 12/2005 | Moiroux et al. |
| 2006/0140452 A1 | 6/2006 | Raynor et al. |
| 2006/0197843 A1 | 9/2006 | Yoshimatsu |
| 2007/0027580 A1 | 2/2007 | Ligtenberg et al. |
| 2007/0177279 A1 | 8/2007 | Cho et al. |
| 2007/0300312 A1 | 12/2007 | Chitsaz et al. |
| 2008/0191864 A1 | 8/2008 | Wolfson |
| 2009/0008683 A1 | 1/2009 | Nishizawa |
| 2009/0015662 A1 | 1/2009 | Kim et al. |
| 2009/0051797 A1 | 2/2009 | Yao |
| 2009/0115915 A1 | 5/2009 | Steinberg et al. |
| 2009/0221368 A1 | 9/2009 | Yen et al. |
| 2009/0262306 A1 | 10/2009 | Quinn et al. |
| 2009/0262343 A1 | 10/2009 | Archibald |
| 2009/0309826 A1 | 12/2009 | Jung et al. |
| 2010/0073499 A1 | 3/2010 | Gere |
| 2010/0079426 A1 | 4/2010 | Pance et al. |
| 2010/0103172 A1 | 4/2010 | Purdy |
| 2010/0230729 A1 | 9/2010 | Ellis-Monaghan et al. |
| 2010/0309287 A1 | 12/2010 | Rodriguez |
| 2011/0215433 A1 | 9/2011 | Kokubun |
| 2012/0044322 A1 | 2/2012 | Tian et al. |
| 2012/0050490 A1 | 3/2012 | Chen et al. |
| 2013/0001728 A1 | 1/2013 | DeAmicis |
| 2013/0075607 A1 | 3/2013 | Bikumandla et al. |
| 2014/0217264 A1 | 8/2014 | Shepard et al. |
| 2016/0307325 A1 | 10/2016 | Wang et al. |

(56) References Cited

U.S. PATENT DOCUMENTS

FOREIGN PATENT DOCUMENTS

| EP | 167314 | 1/1990 |
|---|---|---|
| EP | 1562233 | 8/2005 |
| EP | 2053844 | 4/2009 |
| EP | 2525406 | 11/2012 |
| JP | 2001-267544 | 9/2001 |
| JP | 2002-354493 | 12/2002 |
| JP | 2003-299113 | 10/2003 |
| JP | 2005-197792 | 7/2005 |
| JP | 2005-223084 | 8/2005 |
| JP | 2008-060195 | 3/2008 |
| JP | 2010-212668 | 9/2010 |
| JP | 2011-187565 | 9/2011 |
| JP | 2013-098446 | 5/2013 |
| KR | 10-2007-0100890 | 10/2007 |
| KR | 10-2009-0049343 | 5/2009 |
| KR | 102010-0102043 | 9/2010 |
| KR | 102011-0053796 | 5/2011 |
| KR | 102011-0102192 | 9/2011 |
| WO | WO93/11631 | 6/1993 |
| WO | WO2007/100057 | 9/2007 |
| WO | WO2009/001512 | 12/2008 |

OTHER PUBLICATIONS

Koschan et al., "Finding Objects in a 3D Environment by Combining Distance Measurement and Color Indexing," IEEE, vol. 1, pp. 858-861, Oct. 2001.

Sokolova et al., "Experiments in Stereo Vision," Computer Science 570, Final Project, http://disparity.wikidot.com/, 14 pages, at least as early as Jun. 16, 2010.

Stern et al., "Three-Dimensional Image Sensing, Visualization, and Processing Using Integral Imaging," *Proceedings of the IEEE*, Mar. 2006, vol. 94, No. 3, pp. 591-607.

Thomas, "An Introduction to Photo Stitching," *Eastern Suburbs Photographic Society*, 2007, 12 pages.

Wang, *Video Processing and Communications*, 2001, Prentice-Hall, Chapter 1: Video Formation, Perception, and Representation, pp. 1-32.

Yeh, Hsiu-Chi, "Hardware Components for Real-Time Stereo Matching: Acceleration of 3D HD TV with FPGAs," Delft University of Technology, M.Sc. Thesis, 2012, 99 pages.

U.S. Appl. No. 12/206,546, filed Sep. 8, 2008, Slack et al.
U.S. Appl. No. 12/238,633, filed Sep. 26, 2008, Pance et al.
U.S. Appl. No. 12/570,966, filed Sep. 30, 2009, Bilbrey et al.
U.S. Appl. No. 12/857,903, filed Aug. 17, 2010, Kessler et al.
U.S. Appl. No. 12/889,987, filed Sep. 24, 2010, Kessler et al.
U.S. Appl. No. 13/013,894, filed Jan. 26, 2011, Gere et al.
U.S. Appl. No. 13/959,362, filed Aug. 5, 2013, Fan et al.

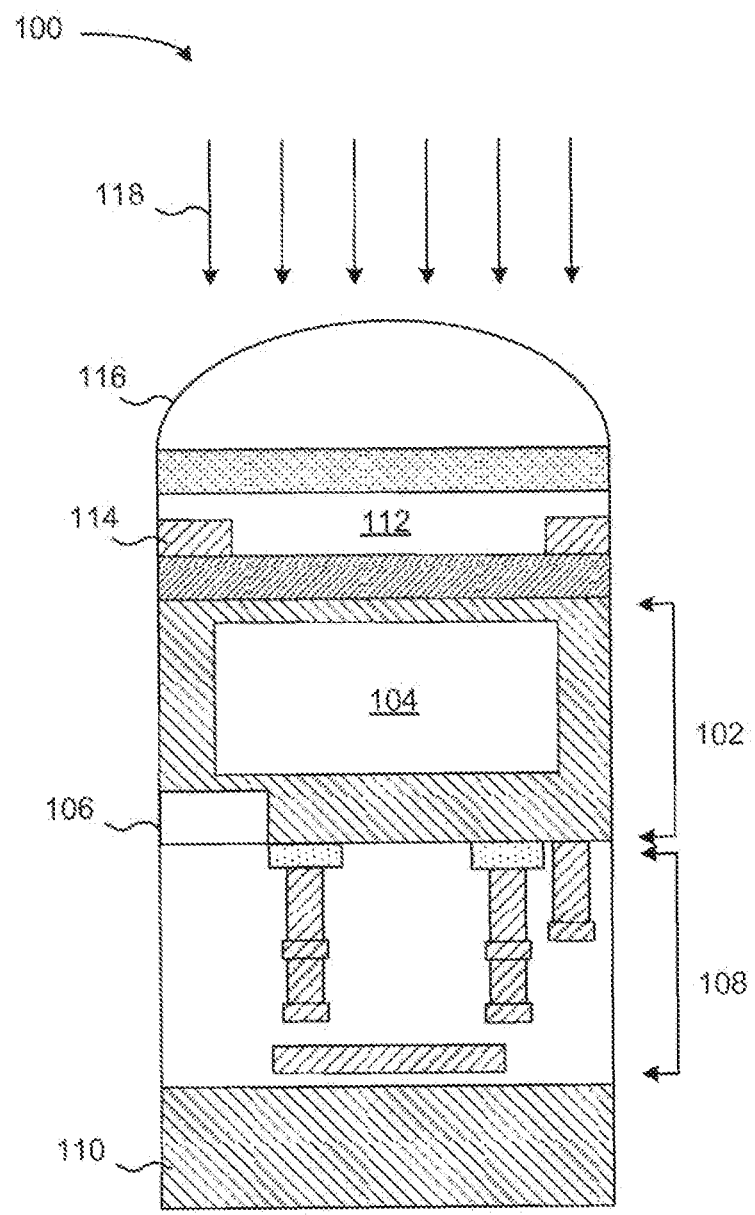
FIG. 1 – Prior Art

IMAGE SENSOR WITH BURIED LIGHT SHIELD AND VERTICAL GATE

CROSS-REFERENCE TO RELATED APPLICATION

This application is a continuation of U.S. patent application Ser. No. 13/959,362, filed Aug. 5, 2013, entitled "Image Sensor with Buried Light Shield and Vertical Gate," which is incorporated by reference in its entirety as if fully disclosed herein.

TECHNICAL FIELD

The present invention relates generally to electronic devices, and more specifically, to image sensors for electronic devices.

BACKGROUND

Cameras and other image recording devices often capture images with one or more image sensors, such as a charge-coupled device (CCD) image sensor or a complementary metal-oxide-semiconductor (CMOS) image sensor. Images are captured by converting light into electrical signals. An array of photodetectors accumulates photo-generated charge (e.g., electrons) in response to light striking the photodetectors. The amount of charge accumulated by each photodetector represents the intensity of the light received by that photodetector. The charge accumulated in all of the photodetectors collectively forms the image.

A CMOS image sensor can be configured as a frontside illuminated (FSI) or as a backside illuminated (BSI) image sensor. A FSI image sensor positions one or more patterned metal layers over the substrate containing an array of photodetectors. The metal layer includes the signal lines that connect the various electrical components in the pixels to operational and power supply circuitry located outside of the array. However, a FSI configuration means light must first pass through the metal layer before it is detected by the photodetectors. The metal layer can interfere with light transmission by reflecting some of the light as the light passes through the metal layer, which can reduce the amount of light detected by the photodetectors.

A BSI image sensor flips the metal layer and the substrate containing the array of photodetectors so that the array of photodetectors is positioned above the metal layer. Light is received by the photodetectors without having to pass through the metal layer. Image quality can be improved with a BSI image sensor because the photodetectors can detect more of the incident light.

Rolling shutter and global shutter are two different methods used by an image sensor to capture an image. With rolling shutter, all of the photodetectors in the image sensor do not capture the image simultaneously. Instead, different parts of the image sensor capture the image at different points in time. For example, all of the photodetectors in one row can accumulate charge during the same time period to capture an image, but the accumulation period for each row starts and ends at slightly different times. For example, the top row of photodetectors can be the first row to start accumulating charge and the first row to stop, with the start and stop times slightly delayed for each subsequent row of photodetectors. Images captured with rolling shutter can be subject to motion artifacts such as wobble, skew, and partial exposure because the rows of photodetectors capture the image at slightly different times.

With global shutter, all of the pixels accumulate charge at the same time. During a global shutter operation, the accumulated charge in the photodetectors is transferred simultaneously to storage regions located in the pixels before being read out of the image sensor. Typically, charge is read out of the pixels one row at a time. So storing the charge in storage regions allows the photodetectors to begin capturing the next image while the charge in the storage regions is read out of the image sensor.

FIG. 1 depicts a simplified pixel in a backside illuminated CMOS global shutter image sensor according to the prior art. The pixel 100 includes a sensing layer 102 that contains a photodetector 104 and a storage region 106. A metal layer 108 is located between a carrier wafer 110 and the sensing layer 102. The signal lines in the metal layer 108 are formed in a dielectric material so that the signal lines are electrically isolated from each other. A microlens 116 focuses light 118 onto the photodetector 104. The light shield 114 in layer 112 is positioned to shield the storage region 106 from the light 118 to prevent charge accumulation in the storage region 106. However, the distance between the storage region 106 and the light shield 114 can be two to three microns or more. This distance means light coming in a certain angles can still strike the storage region and cause unwanted charge to accumulate in the storage region 106. This unwanted charge is added to the photo-generated charge when the accumulated photo-generated charge in the photodetector 104 is transferred to the storage region 106 during a global shutter operation. The additional unwanted charge can cause image artifacts, and can result in an inaccurate image capture or representation of the imaged scene.

SUMMARY

In one aspect, at least one pixel in an image sensor can include a photodetector disposed in a substrate adjacent to a first surface of the substrate, and a storage region disposed in the substrate adjacent to a second surface of the substrate. The second surface can be opposite the first surface. For example, the first surface can be a backside surface of the substrate and the second surface the frontside surface of the substrate. A buried light shield is disposed between the photodetector and the storage region. A sense region, such as a floating diffusion, can be adjacent to the storage region with the buried light shield disposed between the photodetector and the storage and sense regions.

In another aspect, a method for producing a pixel in an image sensor can include providing a photodetector in a first substrate adjacent to a first surface of the first substrate and providing a storage region in a second substrate adjacent to a second surface of the second substrate. The second surface is a surface that can be opposite the first surface. For example, the first surface can be a back surface of the first substrate and the second surface can be a front surface of the second substrate. A buried light shield is provided between the first substrate and the second substrate.

In another aspect, a method for fabricating a pixel in a backside illuminated image sensor can include forming a buried light shield over a frontside surface of a first substrate and attaching a second substrate to a frontside surface of the buried light shield. A first trench is then formed through the second substrate and through the buried light shield. An epitaxial layer is formed in the first trench. A second trench is then formed through the epitaxial layer to produce a transfer channel of epitaxial material along the sidewalls of the first trench. The second trench is filled with a conductive material and a conductive gate formed over the filled trench.

The filled trench and the conductive gate form a vertical gate in the pixel. A photodetector is formed in the first semiconductor substrate and a storage region is formed in the second semiconductor substrate. The transfer channel of epitaxial material provides a channel for charge to transfer from the photodetector to the storage region.

In yet another aspect, a method for forming a buried light shield in a substrate can include forming an implant region in the substrate and forming a trench in the substrate to the implant region. A void is then formed in the substrate by removing the implant region through the trench. The void is filled with a material that prevents light transmission through the material-filled void. For example, the void can be filled with a light reflecting material or with a light absorbing material.

And in yet another aspect, at least one pixel in a backside illuminated image sensor can include a first stage of a light pipe disposed in a first substrate and a photodetector disposed in a second substrate. The photodetector can be a second stage of the light pipe. A storage region is also disposed in the second substrate. The storage node can be disposed adjacent to a frontside surface of the second substrate. The first stage of the light pipe directs light to the photodetector and not to the storage region.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

FIG. 1 depicts a simplified pixel in a backside illuminated image sensor according to the prior art;

DETAILED DESCRIPTION

Embodiments described herein include a global shutter image sensor that includes a buried light shield in at least one pixel to shield the storage region. In one embodiment, the storage region is disposed in a substrate adjacent to one surface of the substrate while a photodetector is disposed in the substrate adjacent to the opposite surface of the substrate. The buried light shield is disposed between the photodetector and the storage region.

In another embodiment, the photodetector is disposed adjacent to a first surface of a first substrate while the storage region is adjacent to a second surface of a second separate substrate. The second surface is the surface opposite to the first surface. For example, the first surface can be a back surface of the first substrate and the second surface a front surface of the second substrate. The buried light shield is disposed between the first and second substrates so that the buried light shield is positioned between the photodetector and the storage region. A vertical gate is formed through the second substrate and the buried light shield to the first substrate that contains the photodetector. A transfer channel formed adjacent to, or around the vertical gate provides a channel for the charge to transfer from the photodetector in the first substrate to the storage region in the second substrate.

A light pipe can be used in some embodiments to direct the light to a light pipe photodetector. A buried light shield having an aperture can be formed in the substrate. The light pipe can be adjacent to the backside of the substrate and extend through the aperture in the buried light shield. The light pipe photodetector can operably connect with the light pipe. The light pipe photodetector can be formed in a material having a low refractive index to confine light into a small region of the light-pipe photodetector. A storage region can be disposed adjacent to the photodetectors. In one embodiment, the storage region is formed in the photodetector adjacent to a frontside surface of the substrate.

Directional terminology, such as "top", "bottom", "front", "back", "leading", "trailing", etc., is used with reference to the orientation of the Figure(s) being described. Because components in various embodiments can be positioned in a number of different orientations, the directional terminology is used for purposes of illustration only and is in no way limiting. When used in conjunction with layers of an image sensor wafer, image sensor die, or corresponding image sensor, the directional terminology is intended to be construed broadly, and therefore should not be interpreted to preclude the presence of one or more intervening layers or other intervening image sensor features or elements. Thus, a given layer that is described herein as being formed on, formed over, disposed on, or disposed over another layer may be separated from the latter layer by one or more additional layers.

Figures 2A, 2B:
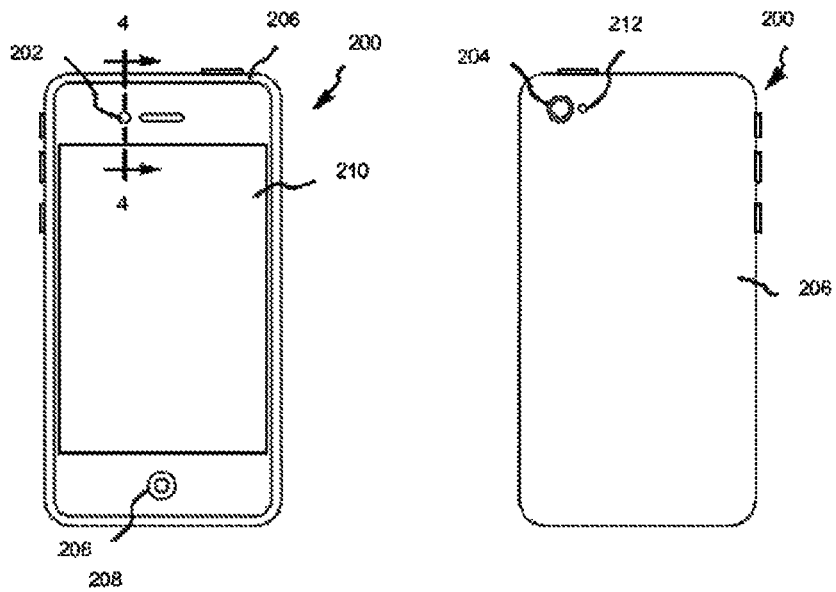
FIG. 2A illustrates a front perspective view of an electronic device including one or more cameras.
FIG. 2B depicts a rear perspective view of the electronic device of FIG. 2A.

Referring now to FIGS. 2A-2B, there are shown front and rear perspective views of an electronic device that includes one or more cameras. The electronic device 200 includes a first camera 202, a second camera 204, an enclosure 206, a display 210, an input/output (I/O) member 208, and a flash 212 or light source for the camera or cameras. The electronic device 200 can also include one or more internal components (not shown) typical of a computing or electronic device, such as, for example, one or more processors, memory components, network interfaces, and so on.

In the illustrated embodiment, the electronic device 200 is implemented as a smart telephone. Other embodiments, however, are not limited to this construction. Other types of computing or electronic devices can include one or more cameras, including, but not limited to, a netbook or laptop computer, a tablet computer, a digital camera, a printer, a scanner, a video recorder, and a copier.

As shown in FIGS. 2A-2B, the enclosure 206 can form an outer surface or partial outer surface and protective case for the internal components of the electronic device 200, and may at least partially surround the display 210. The enclosure 206 can be formed of one or more components operably connected together, such as a front piece and a back piece. Alternatively, the enclosure 206 can be formed of a single piece operably connected to the display 210.

The I/O member 208 can be implemented with any type of input or output member. By way of example only, the I/O member 208 can be a switch, a button, a capacitive sensor, or other input mechanism. The I/O member 208 allows a user to interact with the electronic device 200. For example, the I/O member 208 may be a button or switch to alter the volume, return to a home screen, and the like. The electronic device can include one or more input members or output members, and each member can have a single I/O function or multiple I/O functions.

The display 210 can be operably or communicatively connected to the electronic device 200. The display 210 can be implemented with any type of suitable display, such as a retina display or an active matrix color liquid crystal display. The display 210 can provide a visual output for the electronic device 200 or function to receive user inputs to the electronic device. For example, the display 210 can be a multi-touch capacitive sensing touchscreen that can detect one or more user inputs.

Figure 3:
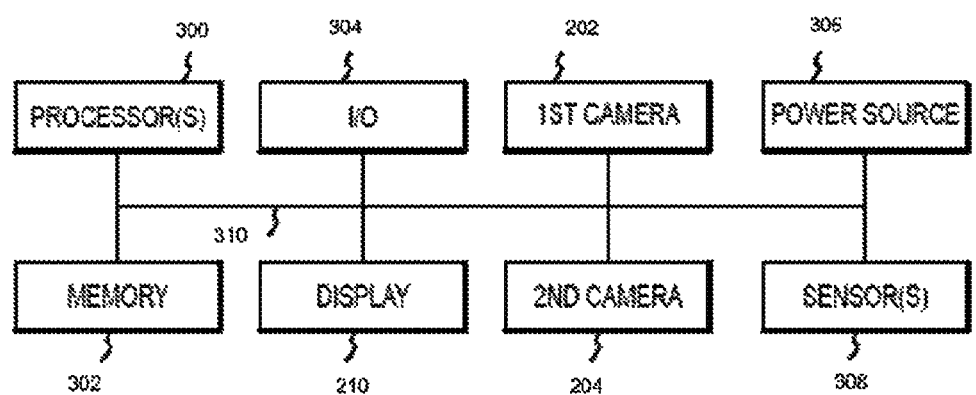
FIG. 3 illustrates a simplified block diagram of the electronic device of FIG. 2.

The electronic device 200 can also include a number of internal components. FIG. 3 illustrates one example of a simplified block diagram of the electronic device 200. The electronic device can include one or more processors 300, storage or memory components 302, input/output interface 304, power sources 306, and sensors 308, each of which will be discussed in turn below.

The one or more processors 300 can control some or all of the operations of the electronic device 200. The processor(s) 300 can communicate, either directly or indirectly, with substantially all of the components of the electronic device 200. For example, one or more system buses 310 or other communication mechanisms can provide communication between the processor(s) 300, the cameras 202, 204, the display 210, the I/O member 304, or the sensors 308. The processor(s) 300 can be implemented as any electronic device capable of processing, receiving, or transmitting data or instructions. For example, the one or more processors 300 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 302 can store electronic data that can be used by the electronic device 200. For example, the memory 302 can store electrical data or content such as, for example, audio files, document files, timing signals, and image data. The memory 302 can be configured as any type of memory. By way of example only, memory 302 can be implemented as random access memory, read-only memory, Flash memory, removable memory, or other types of storage elements, in any combination.

The input/output interface 304 can receive data from a user or one or more other electronic devices. Additionally, the input/output interface 304 can facilitate transmission of data to a user or to other electronic devices. For example, in embodiments where the electronic device 200 is a smart telephone, the input/output interface 304 can receive data from a network or send and transmit electronic signals via a wireless or wired connection. Examples of wireless and wired connections include, but are not limited to, cellular, WiFi, Bluetooth, and Ethernet. In one or more embodiments, the input/output interface 304 supports multiple network or communication mechanisms. For example, the input/output interface 304 can pair with another device over a Bluetooth network to transfer signals to the other device while simultaneously receiving signals from a WiFi or other wired or wireless connection.

The power source 306 can be implemented with any device capable of providing energy to the electronic device 200. For example, the power source 306 can be a battery or a connection cable that connects the electronic device 200 to another power source such as a wall outlet.

The sensors 308 can by implemented with any type of sensors. Examples of sensors include, but are not limited to, audio sensors (e.g., microphones), light sensors (e.g., ambient light sensors), gyroscopes, and accelerometers. The sensors 308 can be used to provide data to the processor 300, which may be used to enhance or vary functions of the electronic device.

Figure 4:
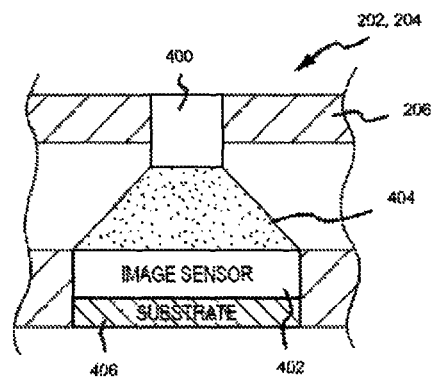
FIG. 4 depicts a cross-section view of the electronic device 200 taken along line 4-4 in FIG. 2A.

As described with reference to FIGS. 2A and 2B, the electronic device 200 includes one or more cameras 202, 204 and optionally a flash 212 or light source for the camera or cameras. FIG. 4 is a simplified cross-section view of the camera 202 taken along line 4-4 in FIG. 2A. Although FIG. 4 illustrates the first camera 202, those skilled in the art will recognize that the second camera 204 can be substantially similar to the first camera 202. In some embodiments, one camera may include a global shutter configured image sensor and one camera can include a rolling shutter configured image sensor. In other examples, one camera can include an image sensor with a higher resolution than the image sensor in the other camera.

The cameras 202, 204 include an imaging stage 400 that is in optical communication with an image sensor 402. The imaging stage 400 is operably connected to the enclosure 206 and positioned in front of the image sensor 402. The imaging stage 400 can include conventional elements such as a lens, a filter, an iris, and a shutter. The imaging stage 400 directs, focuses or transmits light 404 within its field of view onto the image sensor 402. The image sensor 402 captures one or more images of a subject scene by converting the incident light into electrical signals.

The image sensor 402 is supported by a support structure 406. The support structure 406 can be a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Various elements of imaging stage 400 or image sensor 402 can be controlled by timing signals or other signals supplied from a processor or memory, such as processor 300 in FIG. 3. Some or all of the elements in the imaging stage 400 can be integrated into a single component. Additionally, some or all of the elements in the imaging stage 400 can be integrated with image sensor 402, and possibly one or more additional elements of electronic device 200, to form a camera module. For example, a processor or a memory may be integrated with the image sensor 402 in embodiments.

Figure 5:
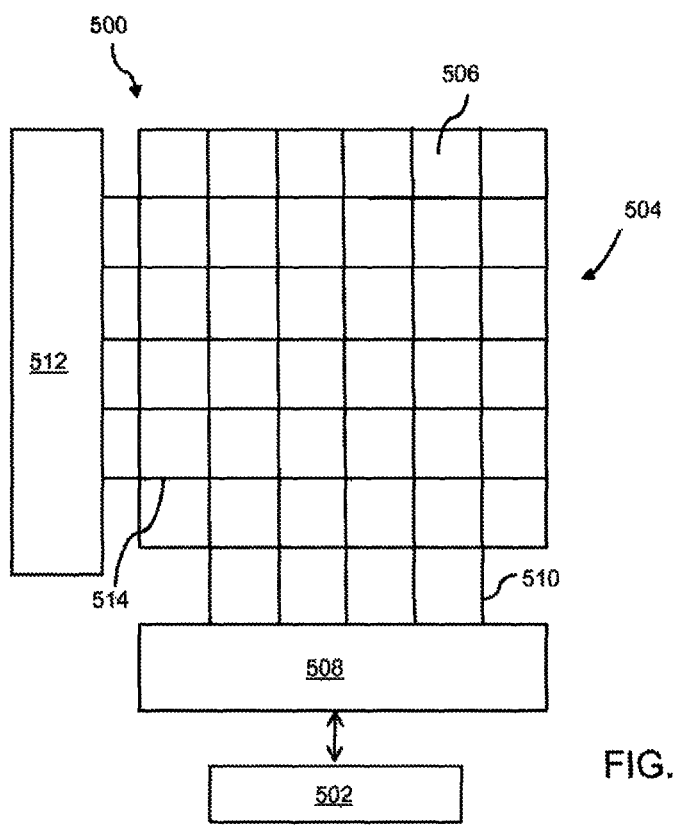
FIG. 5 illustrates a simplified block diagram of one example of an image sensor that is suitable for use as image sensor 402.

Referring now to FIG. 5, there is shown a top view of one example of an image sensor suitable for use as image sensor 402. The image sensor 500 can include an image processor 502 and an imaging area 504. The imaging area 504 is implemented as a pixel array that includes pixels 506. In the illustrated embodiment, the pixel array is configured in a row and column arrangement. However, other embodiments are not limited to this configuration. The pixels in a pixel array can be arranged in any suitable configuration, such as, for example, a hexagon configuration.

The imaging area 504 may be in communication with a column select 508 through one or more column lines 510 and a row select 512 through one or more row lines 514. By way of example only, the row select 512 can include circuitry that produces a row select signal, a transfer signal, and a global shutter signal for each pixel 506. The row select signal, transfer signal, and global shutter signal can be transmitted to each pixel using one or more row lines routed to each pixel. The row select signal selectively activates a particular pixel 506 or group of pixels, such as all of the pixels 506 in a certain row. The column select 508 selectively receives the data output from the select pixels 506 or groups of pixels (e.g., all of the pixels with a particular column).

The row select 512 and/or the column select 508 may be in communication with an image processor 502. The image processor 502 can process data from the pixels 506 and provide that data to the processor 300 and/or other components of the electronic device 200. It should be noted that in some embodiments, the image processor 502 can be incorporated into the processor 300 or separate therefrom.

As discussed previously, an image sensor can use a global shutter to capture an image. Typically, the pixels are reset before integration (i.e., charge accumulation) to remove any residual charge in the pixels. During the integration period, light collection begins and ends at exactly the same time for all pixels. At the end of the integration period, all charges are simultaneously transferred to light shielded storage regions in the image sensor. The light shield prevents unwanted charge from accumulating in the storage region during the integration period, and further can prevent accumulation of charge during the readout process.

Figure 6:
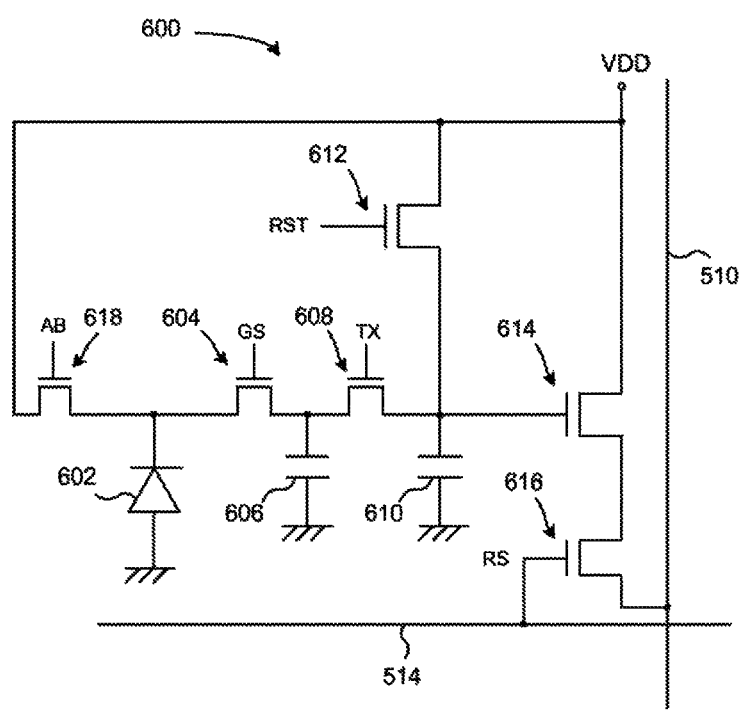
FIG. 6 depicts a simplified schematic view of one example of a global shutter pixel that is suitable for use in a backside illuminated image sensor.

FIG. 6 depicts a simplified schematic view of one example of a global shutter pixel that is suitable for use in a backside illuminated image sensor. The pixel 600 can include a photodetector 602, a first transfer transistor 604, a storage region 606, a second transfer transistor 608, a sense region 610, a reset (RST) transistor 612, a readout transistor 614, a row select (RS) transistor 616, and an anti-blooming transistor 618. The storage region 606 and the sense region 610 are represented as capacitors in the illustrated embodiment because the storage region 606 and the sense region 610 can each temporarily store charge received from the photodetector 602. As described below, after charge is transferred from the photodetector 602, the charge can be stored in the storage region 606 until the gate of the second transfer transistor 608 is pulsed.

One terminal of the first transfer transistor 604 is connected to the photodetector 602 while the other terminal is connected to one terminal of the second transfer transistor 608 and to the storage region 606. The other terminal of the second transfer transistor 608 is connected to the sense region 610, a terminal of the reset transistor 612, and a gate of the readout transistor 614. The other terminal of the reset transistor 612 and one terminal of the readout transistor 614 are connected to a supply voltage VDD. The other terminal of the readout transistor 614 is connected to a terminal of the row select transistor 616. The other terminal of the row select transistor 616 is connected to an output line 510. One terminal of the anti-blooming transistor 618 is connected to the photodetector 602 while the other terminal is connected to the supply voltage VDD.

By way of example only, in one embodiment photodetector 602 is implemented as a photodiode or pinned photodiode, the sense region 606 as a floating diffusion, and the readout transistor 614 as a source follower transistor. The photodetector 602 can be an electron-based photodiode or a hole based photodiode. It should be noted that the term photodetector as used herein is meant to encompass substantially any type of photon or light detecting component, such as a photodiode, pinned photodiode, photogate, or other photon sensitive region. Additionally, the terms storage region and sense region as used herein are meant to encompass substantially any type of charge storing region.

Those skilled in the art will recognize that the pixel 600 can be implemented with additional or different components in other embodiments. For example, a row select transistor can be omitted and a pulsed power supply mode used to select the pixel, the sense region can be shared by multiple photodetectors and transfer transistors, or the reset and readout transistors can be shared by multiple photodetectors, transfer gates, and sense regions. Additionally or alternatively, the anti-blooming transistor can be omitted from the pixel in other embodiments.

When an image is to be captured, an integration period for all of the pixels in the pixel array begins and the photodetectors 602 accumulate photo-generated charge in response to incident light. When the integration period ends, the accumulated charge in all of the photodetectors 602 in the image sensor is simultaneously transferred to a respective storage region 606 by pulsing the gates of the first transfer transistors 604 with a global shutter signal (GS). The photodetectors 602 can then begin accumulating charge to capture another image. When the charge is to be read out of the pixel, the charge in the storage region 606 can be transferred to a sense region 610 by selectively pulsing the gate of the second transfer transistor 608 with a transfer signal (TX).

Typically, the reset transistor 612 is used to reset the voltage on the sense region 610 to a predetermined level prior to the transfer of charge from the storage region 606 to the sense region 610. When charge is to be readout of the pixel, the gate of the row select transistor is pulsed through a respective row select line 514 to select the pixel (or row of pixels) for readout. The readout transistor 614 senses the voltage on the sense region 610 and the row select transistor 616 transmits the voltage to the output line 510. The output line 510 is connected to readout circuitry and (optionally an image processor) through the output line 510 and the column select 508.

Typically, the photodetector 602 has a limit to the amount of charge it can accumulate. The photodetector saturates when the amount of accumulated charge reaches that limit or capacity. Any additional charge that accumulates after saturation can overflow from the photodetector and spill into adjacent photodetectors. This excess charge overflow from the photodetector is known as blooming. Anti-blooming transistor 618 can prevent blooming by allowing the excess charge to drain from the photodetector 602. The gate of the anti-blooming transistor 618 can be selectively pulsed to enable or turn on the anti-blooming transistor 618 and provide an electrical path for excess charge to drain from the photodetector 602. The anti-blooming gate can also function as a photodetector reset transistor in some embodiments. The photodetector 602 can be reset to a known potential prior to image capture.

In some embodiments, an image capture device, such as a camera, may not include a shutter over the lens, and so the image sensor may be constantly exposed to light. In these embodiments, the photodetectors may have to be reset or depleted before a desired image is to be captured. Once the charge from the photodetectors has been depleted, the gates of the first and second transfer transistors and the gate of the reset transistors are turned off, isolating the photodetectors. The photodetectors can then begin integration and collecting photo-generated charge.

Figure 7:
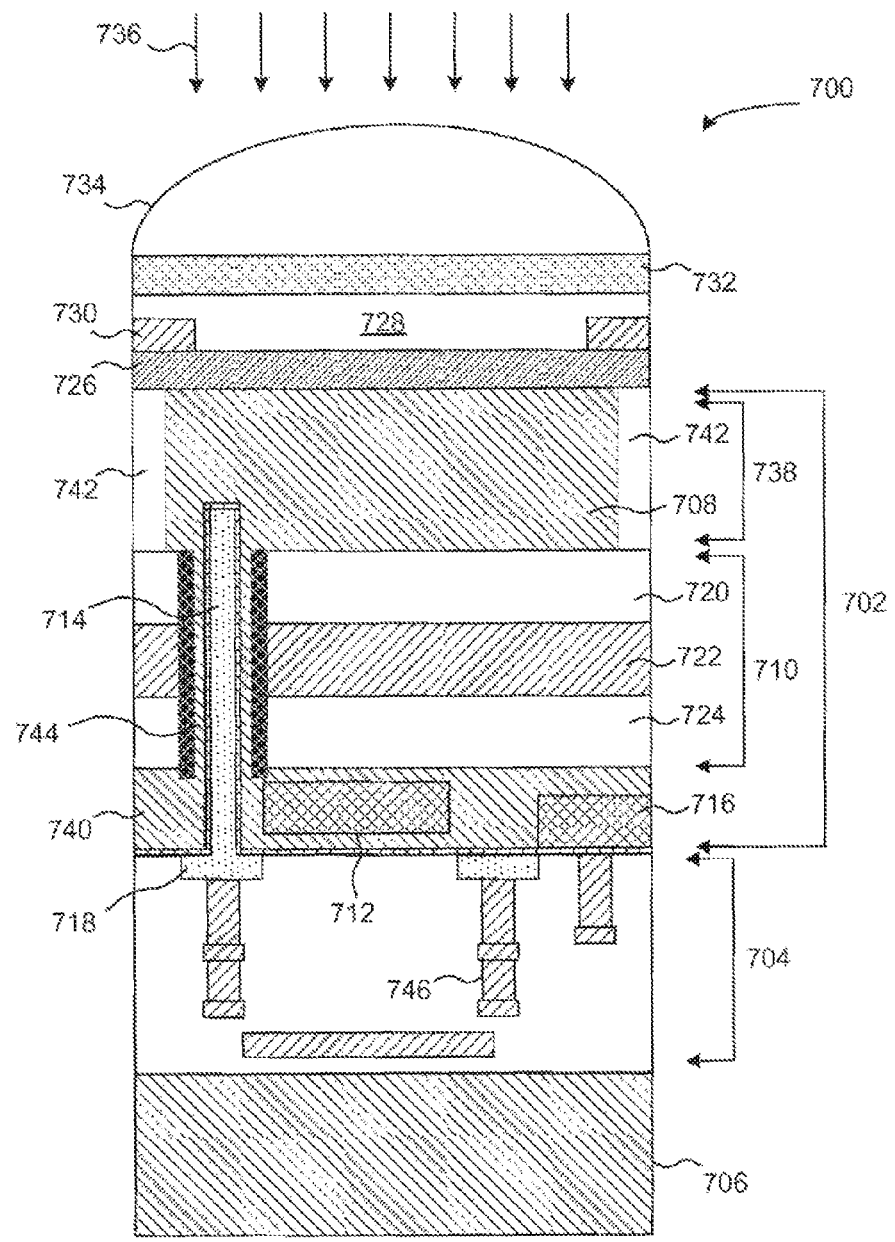
FIG. 7 illustrates a simplified example of a global shutter pixel with a buried light shield that is suitable for use in a backside illuminated image sensor.

Referring now to FIG. 7, there is shown one example of a global shutter pixel in a backside illuminated image sensor that includes a buried light shield. The pixel 700 includes a sensing layer 702 and a metal layer 704. In the illustrated embodiment, the sensing layer 702 is a silicon substrate, but different types of substrates can be used in other embodiments. As used herein, the terms "wafer" and "substrate" are to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

The metal layer 704 is positioned between the sensing layer 702 and a carrier wafer 706. The metal layer 704 can include transistors and signal line routings formed in a dielectric material. The sensing layer 702 can include a photodetector 708, a buried light shield 710, a storage region 712, a vertical gate 714, and a sense region 716. The vertical gate 714 is formed from the photodetector 708, through the buried light shield 710, to a contact pad 718 in the metal layer 704. The vertical gate 714 can be used to reset the photodetector 708, to transfer charge from the photodetector 708, and for anti-blooming operations. The vertical gate 714 can be made of any suitable electrically conductive material, such as polysilicon.

In the illustrated embodiment, the buried light shield 710 includes a first dielectric layer 720, an opaque shield layer 722, and a second dielectric layer 724. By way of example only, the first and second dielectric layers can be oxide layers and the opaque shield layer can be a metal layer such as tungsten. Different dielectrics and/or metals can be used in other embodiments. Additionally or alternatively, first and second dielectric layers 720, 724 can be made of the same dielectric or of different dielectrics.

Disposed over the backside surface of the sensing layer 702 is an optional antireflective coating (ARC) layer 726. The ARC layer 726 can reduce the loss of incident light due to reflection from the surface of the photodetector 708. A second metal layer 728 with light shields 730 is formed over the ARC layer 726. The light shields 730 can reduce optical crosstalk between pixels by covering the regions between neighboring photodetectors.

A filter element 732 can be disposed over the second metal layer 728, and a microlens 734 can be positioned over the filter element 732. The filter element 732 is part of a color filter array that is disposed over all of the pixels in the pixel array. A color filter array is a mosaic of filter elements, where each filter restricts the wavelengths of light that strike a pixel. The light wavelengths can be restricted by color. For example, one filter element can transmit light wavelengths associated with the color red, another color filter element can transmit light wavelengths associated with the color green, and another color filter element can transmit light wavelengths associated with the color blue. The Bayer color filter pattern is a known color filter array that includes red, green, and blue filter elements. Other color filter arrays can filter different light wavelengths. By way of example only, a color filter array can include cyan, magenta, and yellow filter elements.

The buried light shield 710 separates the sensing layer 702 into a first substrate layer 738 and a second substrate layer 740. The sense region 716, the storage region 712, and the pixel transistors can be in the second substrate layer 740 while the photodetector 708 resides in the first substrate layer 738. The photodetector 708 is a transistor source and the sense and storage regions the transistor drains. Isolation trenches 742 electrically isolate the photodetector 708 from adjacent photodetectors in the first substrate layer 738. Charge accumulates in the photodetector 708 when light 736 strikes the photodetector. The buried light shield 710 prevents unwanted charge accumulation in the storage region 712 and in the sense region 716. When the vertical gate 714 is pulsed, the accumulated charge in the photodetector 708 transfers to the storage region 712 using the transfer channel 744 formed around the vertical gate 714. In the illustrated embodiment, the transfer channel 744 is a silicon transfer channel that electrically connects the first and second substrate layers 738, 740. The transfer channel 744 provides an electrical path for charge transfer between the photodetector 708 and the storage region 712. The charge transfers from the storage region 712 to the sense region 716 when the gate 746 is pulsed.

Figure 8:
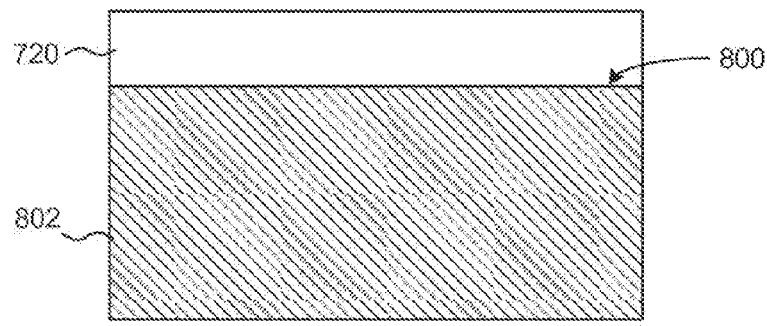
FIGS. 8-28 depict an example method of fabricating a backside illuminated image sensor that includes the pixel 700 shown in FIG. 7.

FIGS. 8-28 illustrate an example method of fabricating a backside illuminated image sensor that includes the pixel 700 shown in FIG. 7. Although the process is described in conjunction with the construction of only one pixel, those skilled in the art will recognize that the method simultaneously fabricates all of the pixels in an image sensor. Initially, the first dielectric layer 720 is formed over a frontside surface 800 of a first semiconductor substrate 802 (FIG. 8). The first dielectric layer can be, for example, an oxide layer that is grown or deposited on the first substrate 802.

Figure 9:
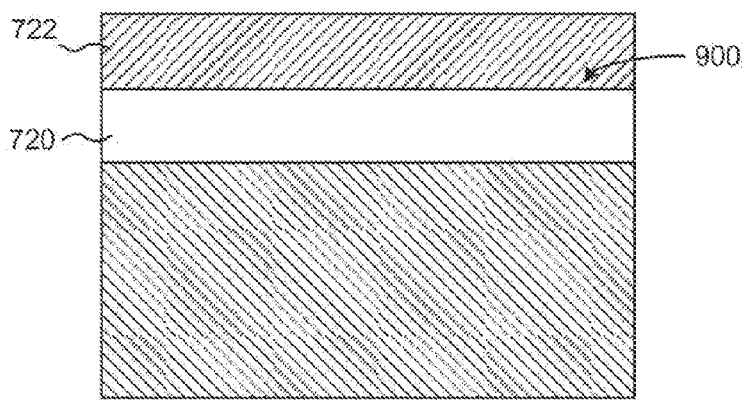

The opaque shield layer 722 is then formed over a frontside surface 900 of the first dielectric layer 720 (FIG. 9). The opaque shield layer 722 can be a metal layer that is deposited over the first dielectric layer. In some embodiments, the opaque shield layer 722 can extend across the image sensor or the imaging area of the image sensor (e.g., imaging area 404 in FIG. 4). Other embodiments can pattern the opaque shield layer 722. The opaque shield layer can be patterned to remove the opaque shield layer from the periphery area (the area adjacent to the imaging area) of the image sensor. Additionally or alternatively, the opaque shield layer 722 can be removed from the array pixel recessed gate regions (e.g., regions 714 and 744).

Figure 10:
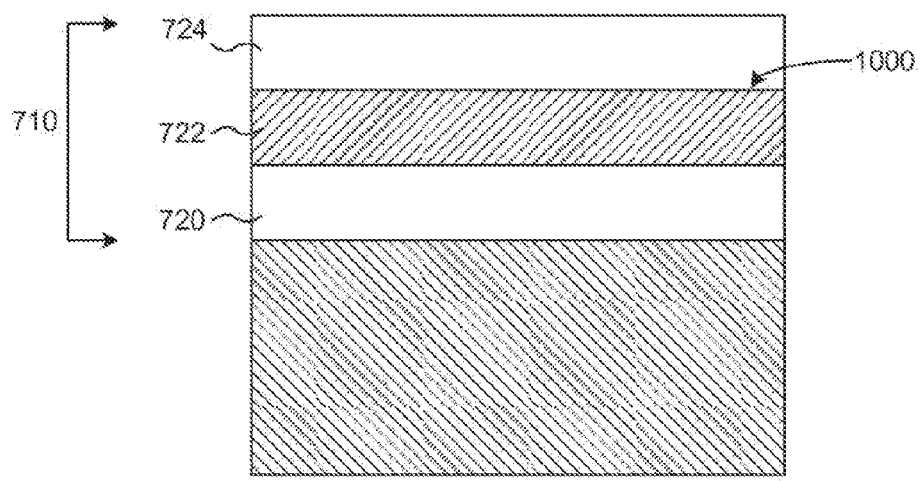

Next, as shown in FIG. 10, a second dielectric layer 724 is formed over a frontside surface 1000 of the opaque shield layer 722. Like the first dielectric layer 720, the second dielectric layer 724 can be an oxide layer that is grown or deposited over the opaque shield layer 722. The combination of the first dielectric layer 720, the opaque shield layer 722, and the second dielectric layer 724 forms the buried light shield 710 in the illustrated embodiment.

Figure 11:
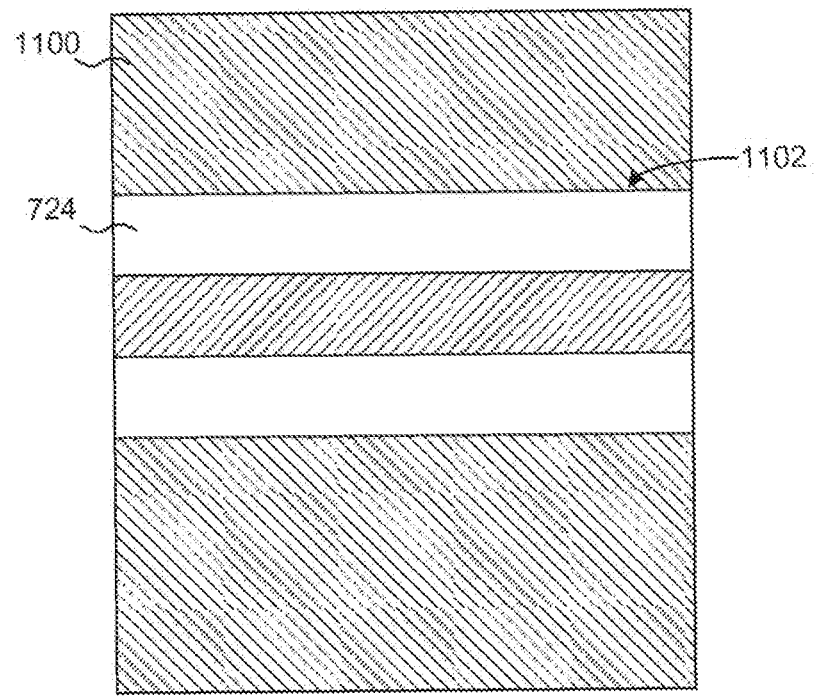
Figure 12:
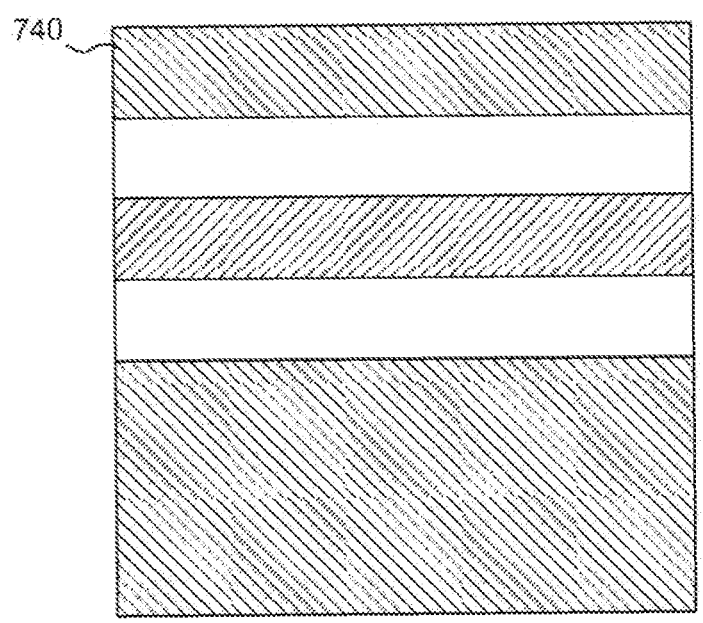

Next, as shown in FIG. 11, a second semiconductor substrate 1100 is wafer bonded to a frontside surface 1102 of the second dielectric layer 724. The second semiconductor substrate 1100 is then thinned using any suitable technique (FIG. 12). By way of example only, the second semiconductor substrate 1100 can be thinned using grinding, polishing or etching techniques in any combination. The thinned second semiconductor substrate is the second substrate layer 740 shown in FIG. 7.

Figure 13:
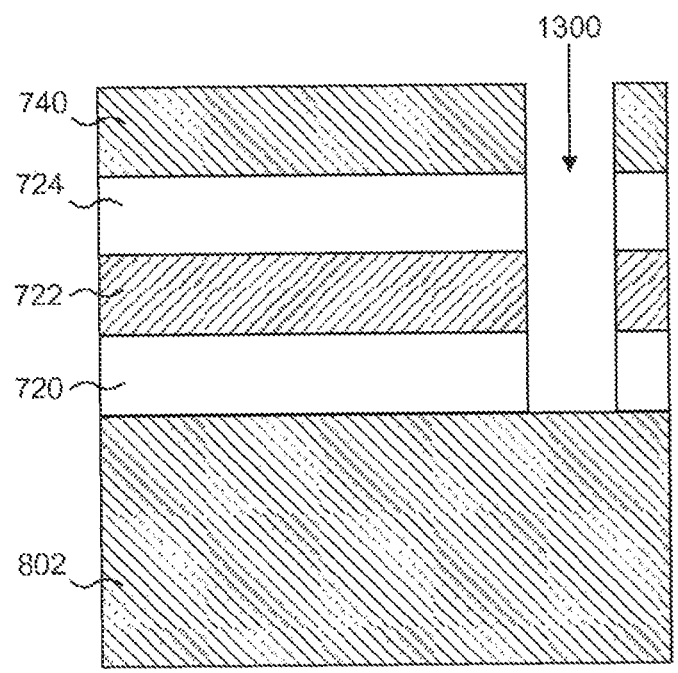
Figure 14:
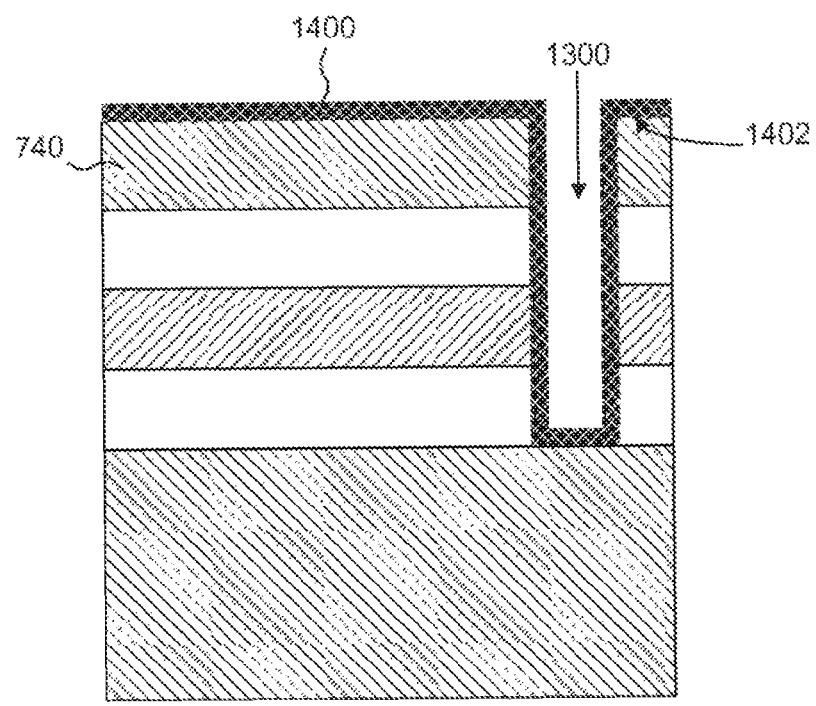
Figure 15:
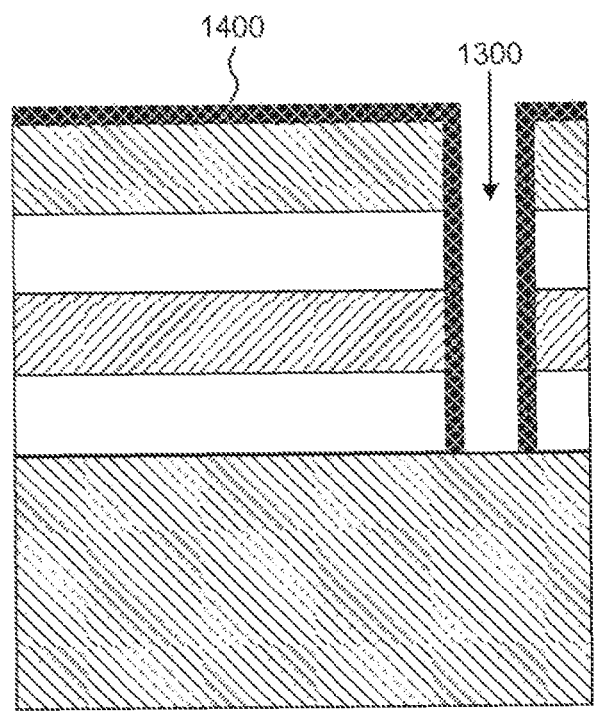
Figure 16:
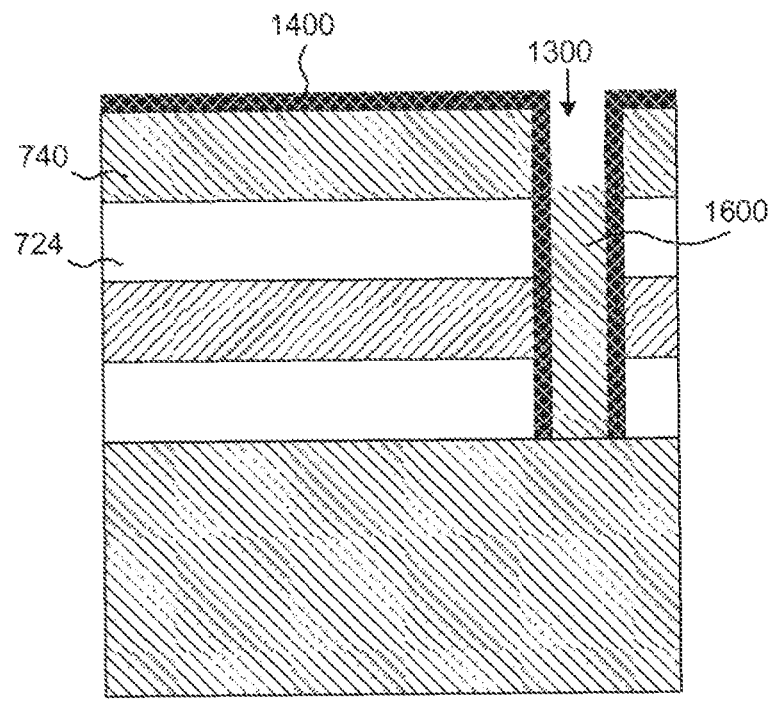
Figure 17:
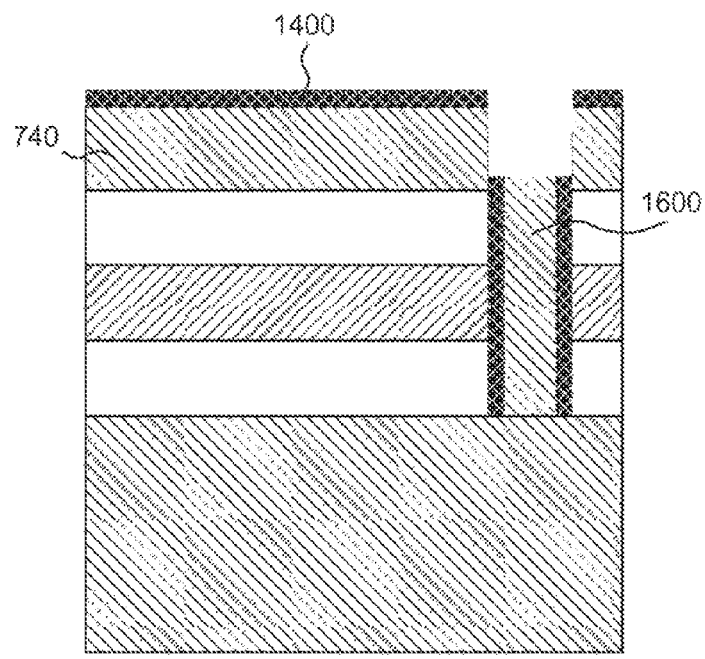

The second substrate layer 740, the second dielectric layer 724, the opaque shield layer 722, and the first dielectric layer 720, are then etched to form a trench 1300 through the layers 740, 724, 722, 720 to the first substrate 802 (FIG. 13). Next, as shown in FIG. 14, a third dielectric layer 1400 is formed over the frontside surface 1402 of the second substrate layer 740, the sidewalls of the trench 1300, and the bottom surface of the trench 1300. For example, a conformal silicon nitride layer can be deposited over the imaging area of the pixel. The third dielectric layer 1400 overlying the bottom surface of the trench 1300 is then removed and a selective epitaxial layer 1600 is grown in the trench 1300 (FIGS. 15 and 16). The epitaxial layer 1600 can be grown as high as the second dielectric layer 724, or have a height that is partially within the thickness of the second substrate layer 740.

Figure 18:
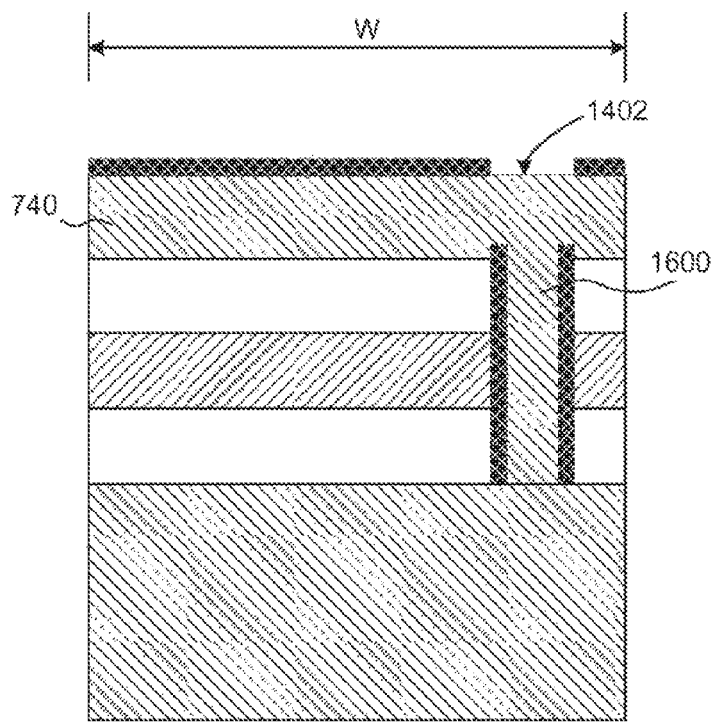
Figure 19:
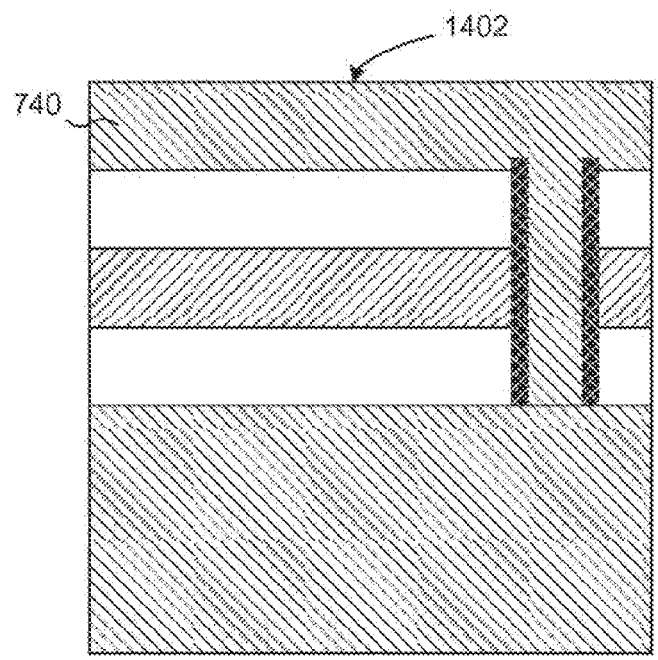

The portions of the third dielectric layer 1400 exposed in the trench 1300 are then removed (FIG. 17) and the epitaxial layer 1600 grown to the frontside surface 1402 of the second substrate layer 740 (FIG. 18). The epitaxial layer 1600 fills in the void left by the trench to make at least a portion of the second substrate layer 740 across the width "W" of the pixel (e.g., horizontal direction) continuous and uninterrupted.

Figure 20:
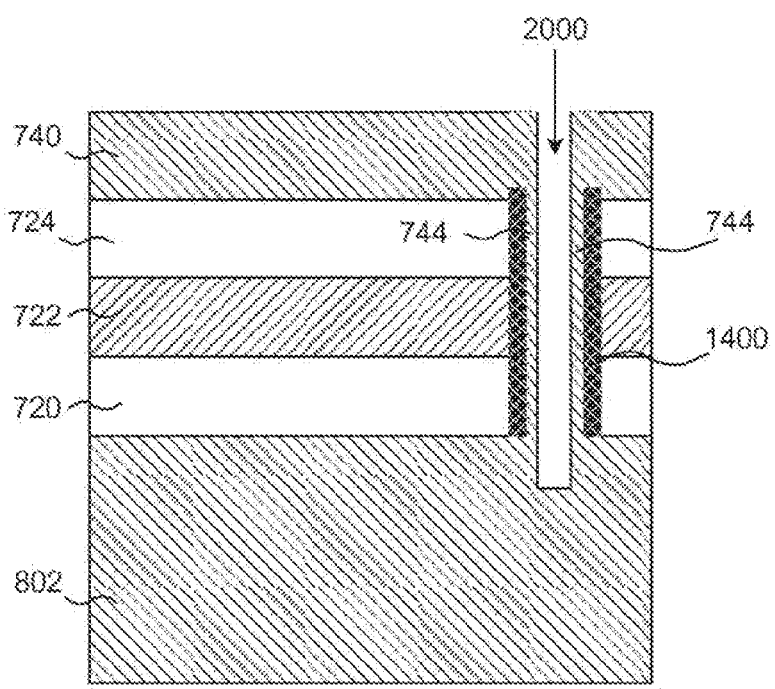

The third dielectric layer 1400 over the frontside surface 1402 of the second substrate layer 740 is removed (FIG. 19) and a trench 2000 formed through the epitaxial layer 1600 into the first substrate 802 (FIG. 20). For example, the epitaxial layer 1600 can be etched to form the trench 2000. The trench 2000 is formed such that the transfer channel 744 lines the sidewalls of the remaining sections of the third dielectric layer 1400 adjacent to the trench 2000 and connects or joins the first substrate 802 to the second substrate layer 740.

Figure 21:
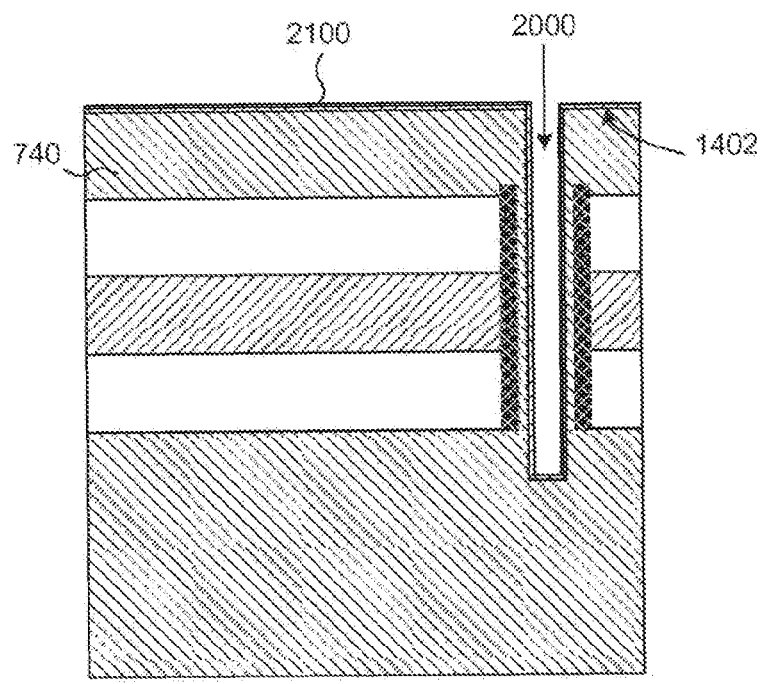
Figure 22:
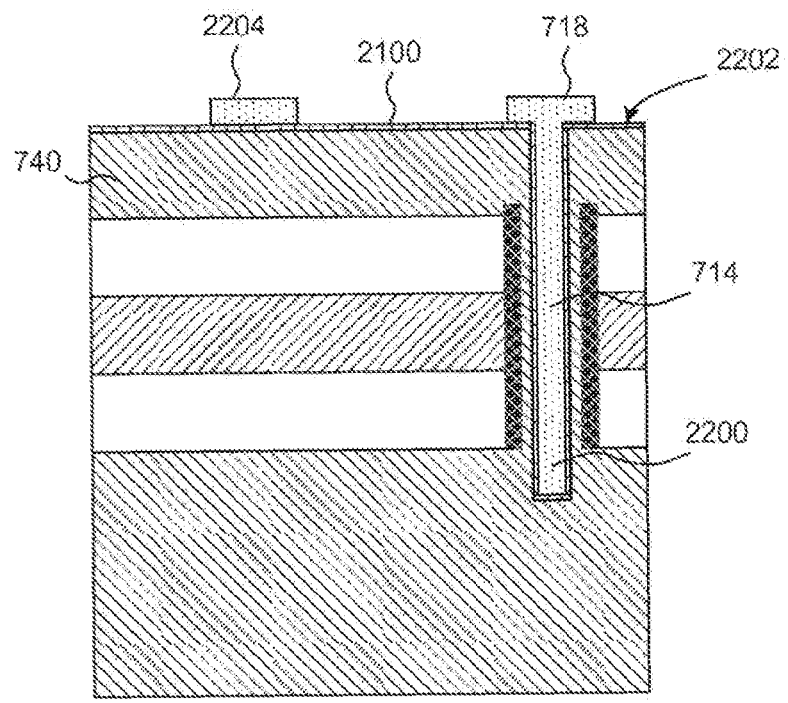

Next, as shown in FIG. 21, a fourth dielectric layer 2100 is formed over the frontside surface 1402 of the second substrate layer 740, the sidewalls of the trench 2000, and the bottom surface of the trench 2000. By way of example only, a gate oxide layer can be grown over the second substrate layer 740, the sidewalls of the trench 2000, and the bottom surface of the trench 2000. A conductive material 2200 is then formed over the frontside surface 2202 of the fourth dielectric layer 2100 and fills the trench 2000 (FIG. 22). The conductive material is patterned to form contact pads 718, 2204 on the frontside surface 2202 of the fourth dielectric layer 2100. The vertical gate 714 is produced by the combination of the conductive material in the trench and the contact pad 718. The conductive material can be, for example, polysilicon. The conductive material can be patterned using any suitable patterning process. For example, a masking layer can be formed and patterned over the pixel and the conductive material removed based on the pattern in the masking layer. The masking layer can be removed after the conductive material has been patterned.

Figure 23:
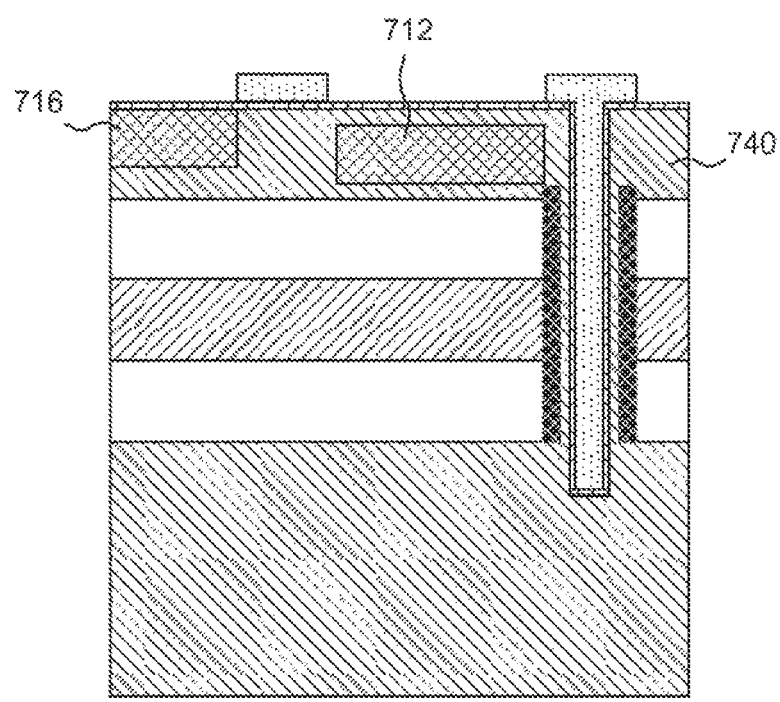

The sense region 716 and the storage region 712 can then be formed in the second substrate layer 740 (FIG. 23). In addition to producing the sense and storage regions 716, 712 additional front end of line (FEOL) processes can be performed. Example FEOL processes include, but are not limited to, shallow trench isolation, P-well and N-well processes, additional gate processing for other transistors, transistor channel and halo implantations, and lightly doped drain (LDD) and source/drain implantations.

Any suitable method can be used to form the sense and storage regions. For example, another masking layer can be formed and patterned over the pixel and respective n-type or p-type dopants implanted into the second substrate layer 740 based on the pattern in the masking layer to produce the sense and storage regions. The masking layer can be removed after the sense and storage regions have been formed. Other embodiments can form the sense and storage regions differently. For example, the sense and storage regions can be formed by diffusing dopants into the second substrate layer.

Figure 24:
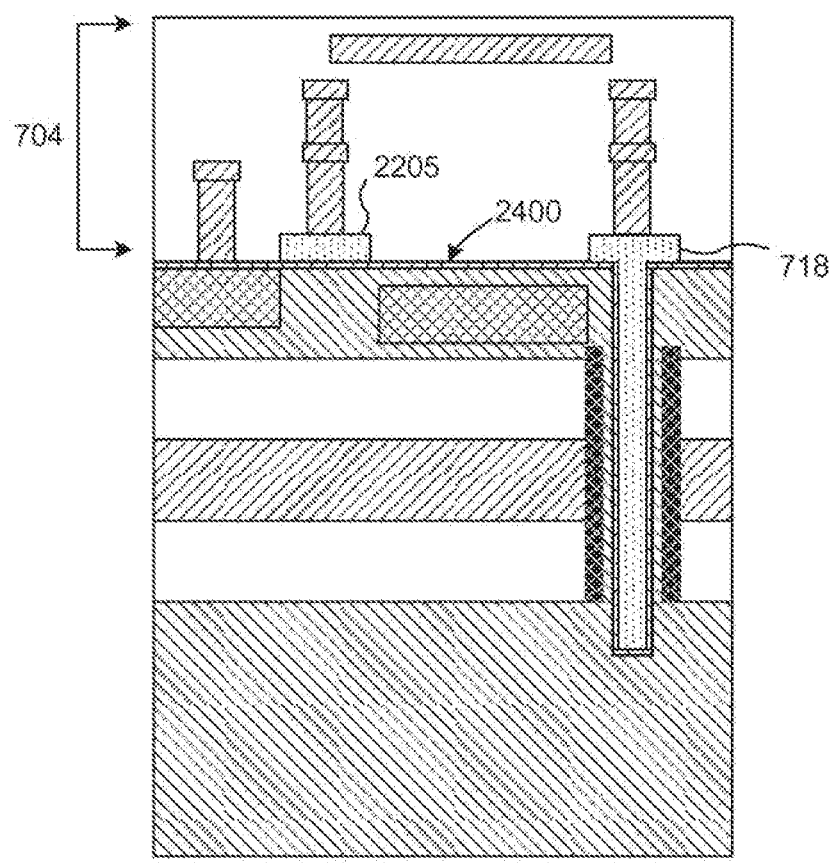
Figure 25:
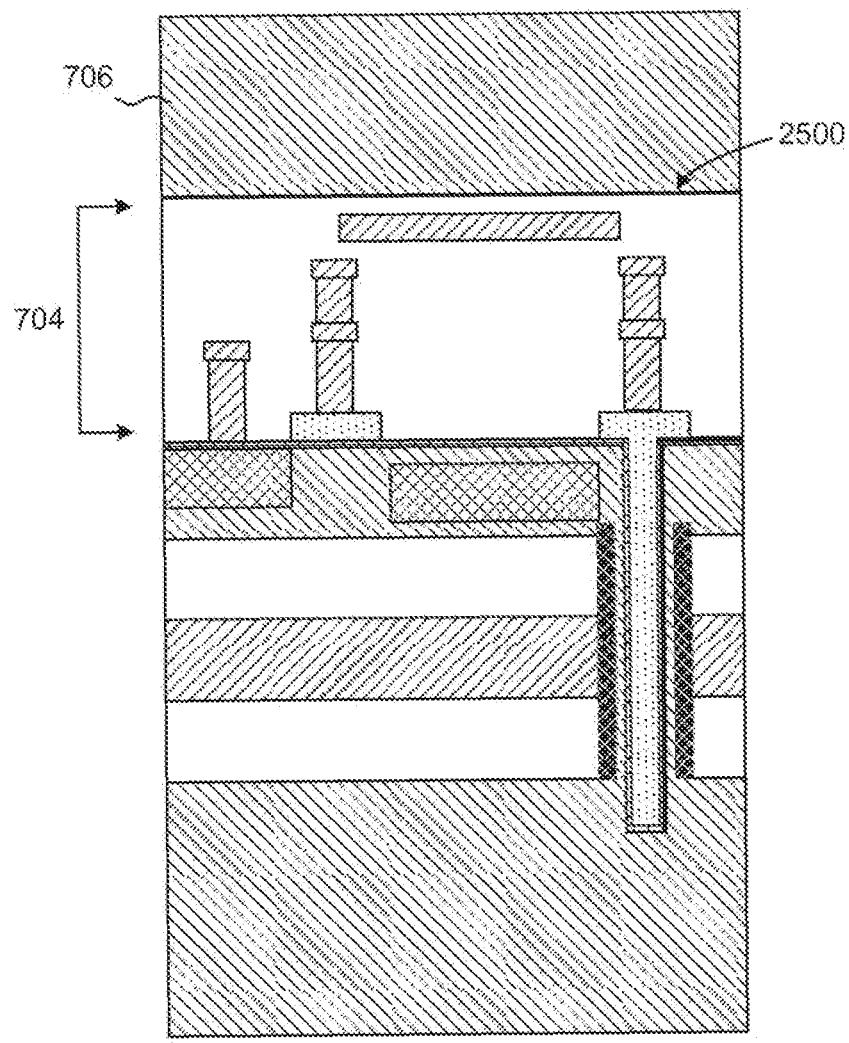
Figure 26:
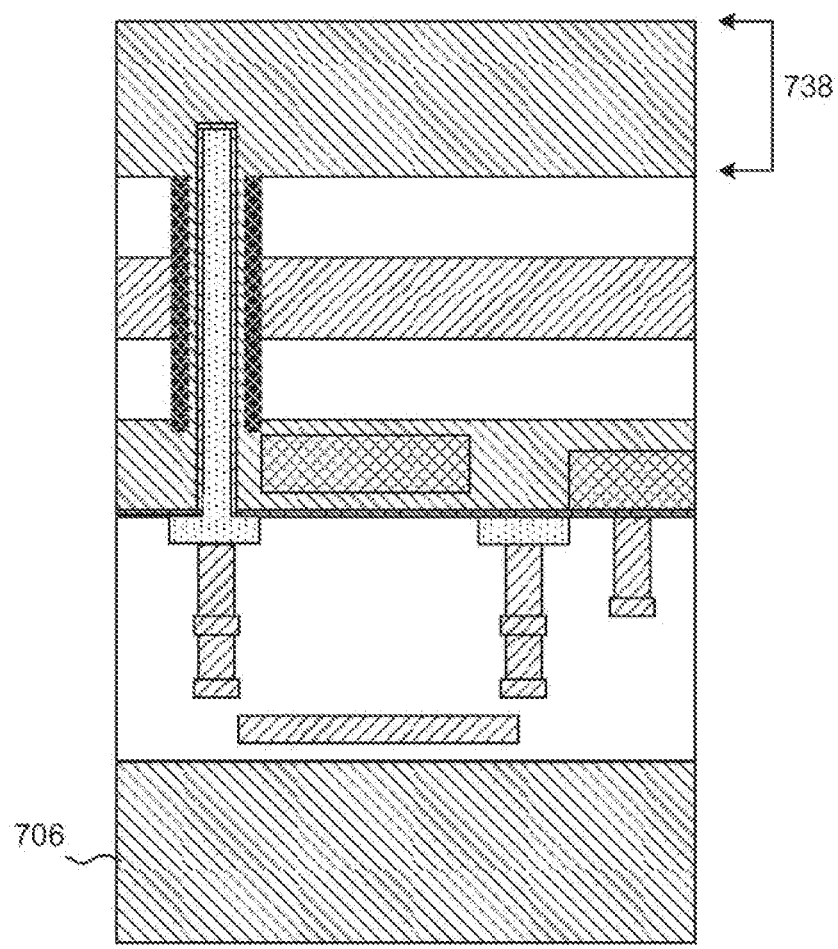
Figure 27:
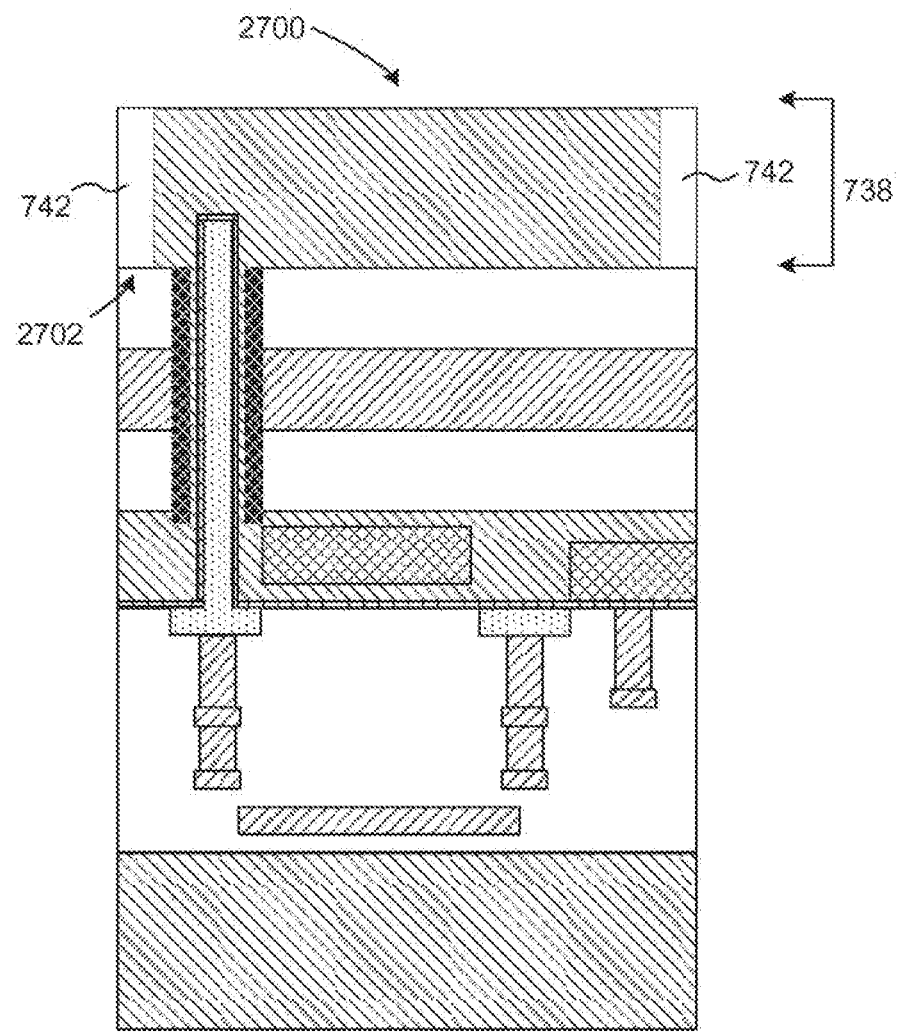
Figure 28:
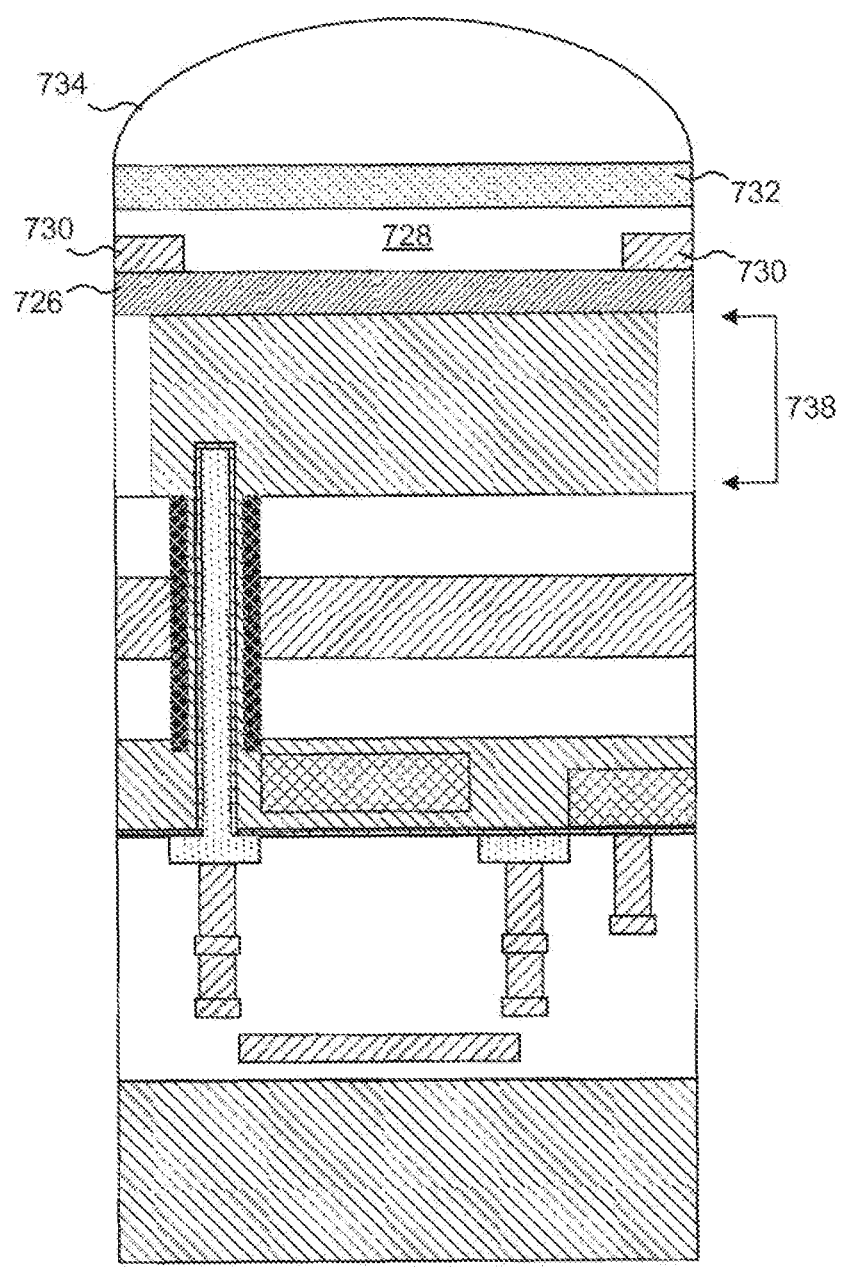

The metal layer 704 is then formed over the contact pads 718, 2204 and the frontside surface 2400 of the fourth dielectric layer 2100 using any known method or methods (FIG. 24). Other back end of line processes may be performed as well, such as contacts, metals, planarization, and dielectric and passivation processes. The carrier wafer 706 is then wafer bonded to the frontside surface 2500 of the metal layer 704 (FIG. 25) and the first substrate 802 thinned (FIG. 26). Note that FIGS. 26-28 show the pixel rotated 180 degrees relative to the orientation of the pixel in FIGS. 8-25. The first substrate 802 can be thinned using any known technique such as grinding, polishing or etching techniques in any combination. The thinned first substrate becomes the sensing layer 738.

Isolation trenches 742 can then be formed through the sensing layer 738 from the backside surface 2700 of the sensing layer 738 to the frontside surface 2702 of the sensing layer 738 using any suitable method (FIG. 27). For example, a masking layer can be formed and patterned over the backside surface 2700 of the sensing layer 738 and the sensing layer etched to produce the isolation trenches 742. Other embodiments can isolate the pixels differently. For example, implant regions or dielectric regions can be used to electrically isolate the photodetectors from each other.

Finally, as shown in FIG. 28, the ARC layer 726, the second metal layer 728 with light shields 730, filter element 732, and the microlens 734 are formed using techniques known in the art.

Dopants for the photodetector can be present in the substrate 802 (substrate pre-doped) at the beginning of the fabrication process (e.g., at FIG. 8), or dopants for the photodetector can be implanted or diffused into the sensing layer 738 prior to the formation of the ARC layer 726. When the sensing layer 738 is doped prior to the formation of the ARC layer 726, a low temperature dopant activation can be performed to not adversely affect the metals already formed on the wafer.

Figure 29:
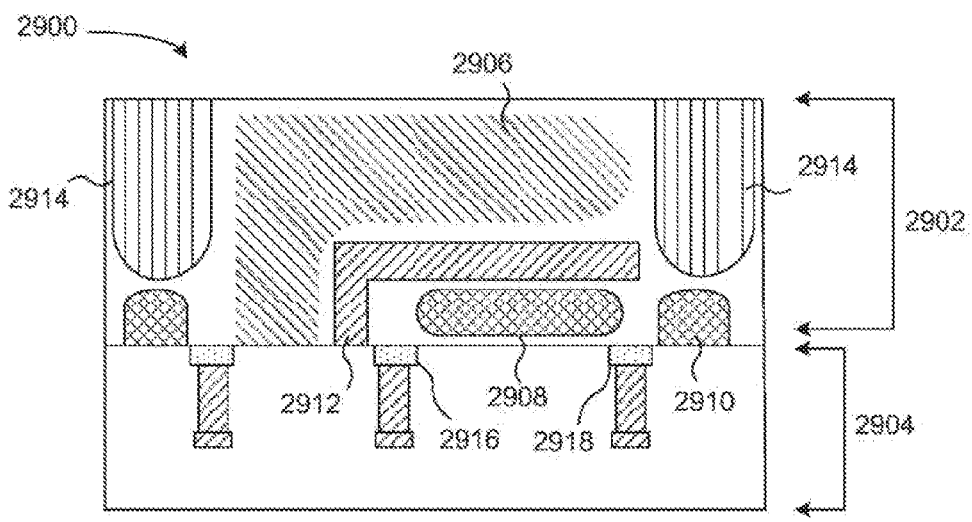
FIG. 29 illustrates another example of a global shutter pixel with a buried light shield that is suitable for use in a backside illuminated image sensor.

Referring now to FIG. 29, there is shown another example of a global shutter pixel with a buried light shield that is suitable for use in a backside illuminated image sensor. The pixel 2900 includes sensing layer 2902 and a metal layer 2904. The sensing layer includes a photodetector 2906, a storage region 2908, and a sense region 2910 adjacent the frontside surface of the sensing layer 2902. A buried light shield 2912 is disposed in the sensing layer 2902 between the photodetector 2906 and the storage region 2908. The buried light shield 2912 can be made of a light absorbing material or a light blocking material. For example, the buried light shield 2912 can reflect light back into the photodetector 2906.

Pixel isolation regions 2914 electrically isolate the photodetector 2906 from adjacent photodetectors in the sensing layer 2902. The gate 2916 is pulsed with a global shutter signal during a global shutter operation to transfer accumulated charge from the photodetector 2906 to the storage region 2908. The gate 2918 can be selectively pulsed to transfer the charge from the storage region 2908 to the sense region 2910.

Figure 30:
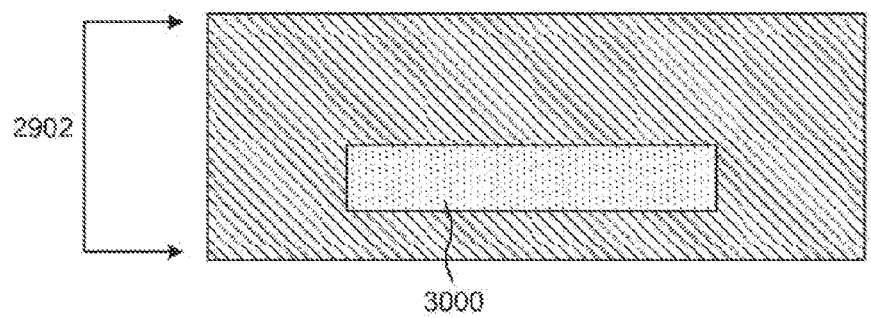
FIGS. 30-33 depict an example method of fabricating the buried light shield 2912 shown in FIG. 29.
Figure 31:
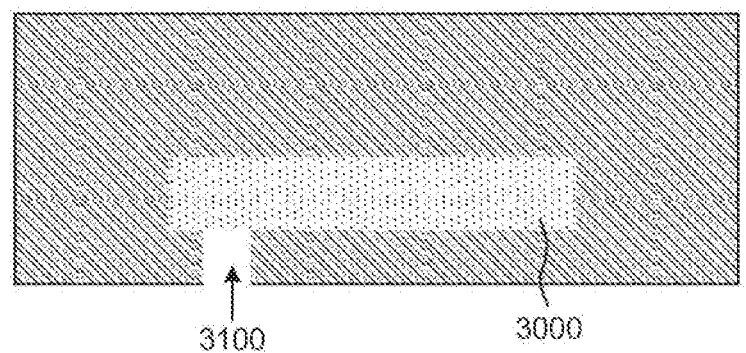

FIGS. 30-33 illustrate an example method of fabricating the buried light shield 2912 shown in FIG. 29. Suitable n-type or p-type dopants can be implanted into the sensing layer 2902 to form implant region 3000 (FIG. 30). The sensing layer 2902 is then etched to form a trench 3100 through the sensing layer 2902 to the implant region 3000 (FIG. 31). The trench can be formed, for example, by dry etching the sensing layer 2902.

Figure 32:
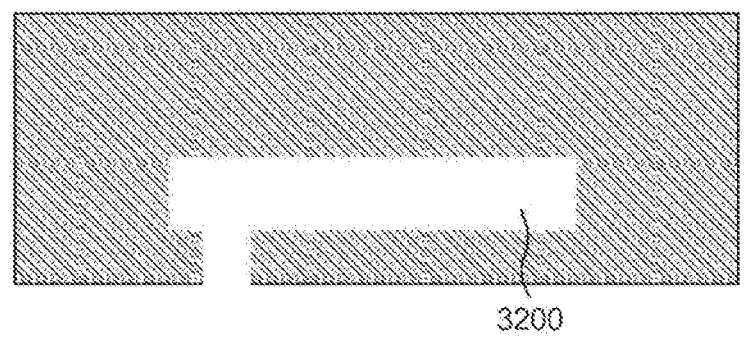
Figure 33:
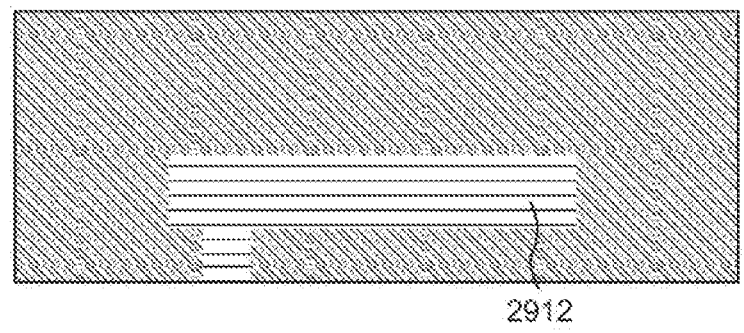

Next, as shown in FIG. 32, the implant region 3000 is removed through the trench 3100 using, for example, a selective wet etch. The empty implant region 3000 and the trench collectively form a void 3200 in the sensing layer 2902. The void 3200 is then filled with a light-absorbing material or a light-blocking material to form the buried light shield 2912 (FIG. 33). In other embodiments, the void 3200 can be filled with a material having an index of refraction that is different from the index of refraction of the material in the sensing layer 2902. By way of example only, metals such as copper, aluminum, tungsten, and/or dielectrics like oxide, nitride, and air can be used since these materials have a different index of refractive index from silicon or other semiconductor materials included in sensing layer 2902. Light will reflect at the interface between the materials having different refractive indices. Thus, the refractive index difference can be used to reflect light away from the storage region 2908. In some embodiments, the use of a light-absorbing material is combined with the use of materials having different refractive indices because the different refractive indices (i.e., light reflection) may not completely block the light.

The void can be filled with the light blocking, light absorbing, or the material having a different index of refraction at any suitable time during the fabrication process of the CMOS image sensor. For example, some materials can withstand higher temperatures, so the void can be filled with these materials earlier in the fabrication process. Materials that cannot withstand higher temperatures can be used to fill the void at a later stage of the fabrication process.

Figure 34:
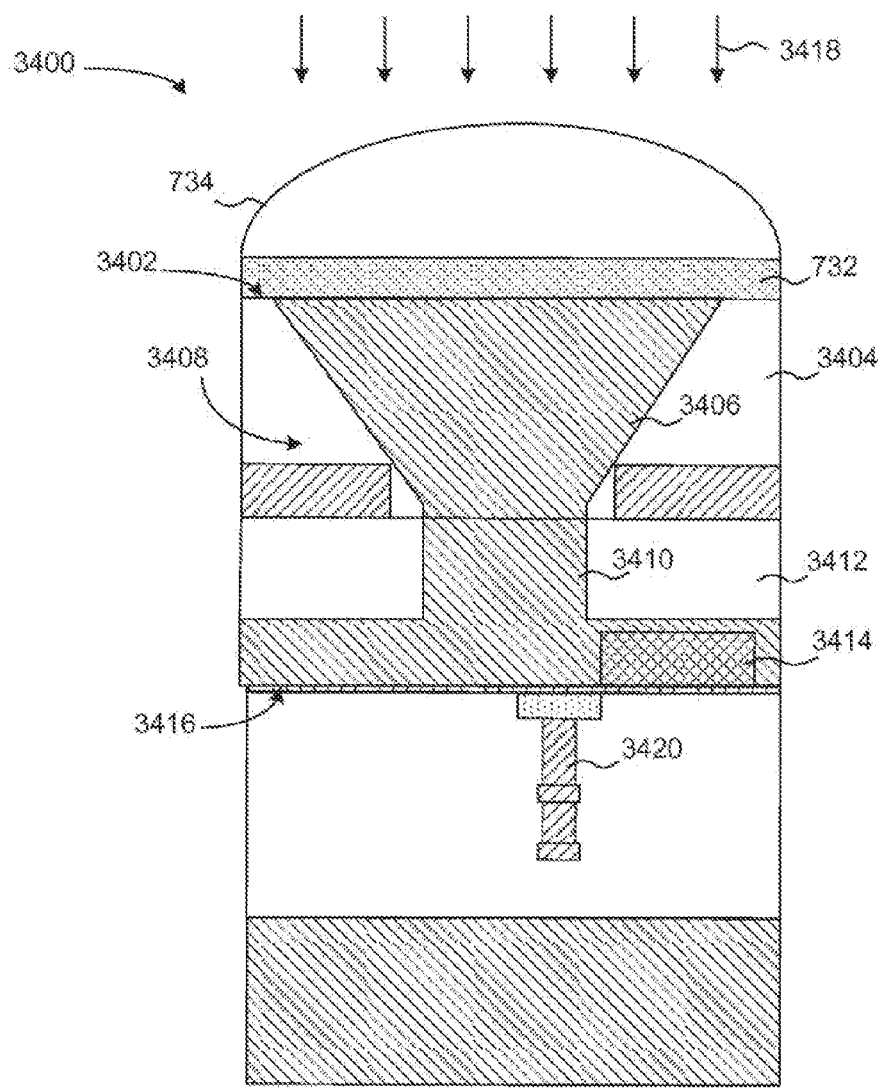
FIG. 34 illustrates another example of a global shutter pixel with a buried light shield that is suitable for use in a backside illuminated image sensor.

A light pipe can be used instead of a buried light shield in other embodiments to direct light away from a storage region. FIG. 34 illustrates another example of a global shutter pixel 3400 that is suitable for use in a backside illuminated image sensor. A microlens 734 and a color filter layer 732 are disposed over a backside surface 3402 of a first substrate 3404. The first substrate 3404 can be any suitable dielectric material, such as an oxide.

A first stage 3406 of a light pipe 3408 is formed through the first substrate 3404 to connect with a second stage 3410 of the light pipe. The second stage 3410 can be disposed in a second substrate 3412. The second substrate 3412 can be any suitable dielectric material, such as an oxide. In the illustrated embodiment, the second stage 3410 is a photodetector that is formed to be narrower than a conventional photodetector.

A storage region 3414 is formed adjacent to a frontside surface 3416 of the second substrate 3412. In some embodiments, the storage region 3414 can reside in the photodetector, such as in the periphery of the photodetector 3410 near an adjacent pixel.

The first stage 3406 and the photodetector 3410 each have a higher refractive index than the material in the first and second substrates 3404, 3412, respectively. The first stage 3406 of the light pipe 3408 confines light 3418 received from the microlens 734 and the color filter layer 732 to a smaller region on the surface of the photodetector 3410. The light pipe 3408 directs or guides the light 3418 into the photodetector 3410 only and not into the storage region 3414. The gate 3420 can be pulsed with a global shutter signal when charge that has accumulated in the photodetector 3410 is to be transferred to the storage region 3414.

In some embodiments, the first substrate 3404 and the second substrate 3412 are a single substrate. The first stage 3406 of the light pipe 3408 and/or the second stage 3410 of the light pipe (i.e., the photodetector) can be formed to have a different shape or dimension in other embodiments. Additionally or alternatively, the photodetector can be separate from the second stage 3410 of the light pipe.

Various embodiments have been described in detail with particular reference to certain features thereof, but it will be understood that variations and modifications can be effected within the spirit and scope of the disclosure. For example, the embodiments of FIGS. 7-28 include a buried light shield formed with an opaque layer between two dielectric layers. Other embodiments can use a silicon-on-insulator (SOI) layer as a buried light shield instead of the opaque layer 722 and the dielectric layers 720, 724. Additionally, the embodiments herein have been described as backside illuminated image sensors with a buried light shield. Other embodiments can include a sensing layer as described in conjunction with FIGS. 7, 29, and 34 in a frontside illuminated image sensor.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

The invention claimed is:

1. An image sensor comprising:
   a first substrate layer comprising:
      a photodetector disposed on a first surface of the first substrate layer;
   a second substrate layer comprising:
      a first storage region disposed adjacent to a second surface of the second substrate, the second surface opposite the first surface;
      a second storage region disposed in the second substrate layer; and
   a buried light shield disposed between the first and second substrate layers, wherein the buried light shield is over the first and second storage regions.

2. The image sensor as in claim 1, further comprising:
   a vertical gate extending from the first substrate layer through the buried light shield to the second substrate layer;
   a transfer channel disposed adjacent to the vertical gate, the transfer channel being operable to provide a channel for charge to transfer from the photodetector to first storage region; and
   a dielectric material formed over the transfer channel.

3. The image sensor as in claim 2, wherein the transfer channel comprises a silicon transfer channel.

4. The image sensor as in claim 1, wherein the buried light shield comprises an opaque shield layer disposed between a first dielectric layer and a second dielectric layer.

5. The image sensor as in claim 1, wherein the buried light shield comprises one of a light-blocking material or a light-absorbing material.

6. The image sensor as in claim 1, wherein the buried light shield comprises a material having an index of refraction that is different from a material in the first substrate layer.

7. The image sensor as in claim 1, wherein the buried light shield comprises a silicon-on-insulator layer.

8. The image sensor as in claim 1, wherein the image sensor is a backside illuminated image sensor and the photodetector is adjacent a backside surface of the first substrate layer and the first and second storage regions are adjacent a frontside surface of the second substrate layer.

9. The image sensor as in claim 8, further comprising:
an anti-reflective coating formed over the backside surface of the first substrate layer; and
at least one light shield formed over the anti-reflective coating.

10. An image sensor comprising:
a sensing layer formed in a first substrate, the sensing layer comprising:
a photodetector;
a storage region; and
a buried light shield disposed below the photodetector and over storage region;
a second substrate attached to the first substrate, the second substrate comprising a contact pad;
a vertical gate extending between the first substrate through the buried light shield to the contact pad; and
a transfer channel disposed adjacent to the vertical gate operatively connecting the photodetector to the storage region and providing a charge transfer path between the photodetector and the storage region.

11. The image sensor as in claim 10, further comprising a dielectric material formed over the transfer channel.

12. The image sensor as in claim 10, wherein the buried light shield divides the first substrate into a first substrate layer and a second substrate layer, and wherein the photodetector is disposed in the first substrate layer and the storage region is disposed in the second substrate layer.

13. The image sensor as in claim 12, wherein the storage region comprises a first storage region and the image sensor further comprises a second storage region disposed in the second substrate layer adjacent the first storage region and below the buried light shield.

14. The image sensor as in claim 10, wherein the image sensor comprises a backside illuminated image sensor and the photodetector is adjacent a backside surface of the first substrate and the first and second storage regions are adjacent a frontside surface of the first substrate.

15. The image sensor as in claim 14, further comprising:
an antireflective coating layer disposed over the backside surface of the first substrate; and
at least one light shield formed over the anti-reflective coating.

16. The image sensor as in claim 10, wherein the buried light shield comprises an opaque shield layer disposed between a first dielectric layer and a second dielectric layer.

17. The image sensor as in claim 10, wherein the buried light shield comprises only one of a light-blocking material or a light-absorbing material.

18. The image sensor as in claim 10, wherein the buried light shield comprises a material having an index of refraction that is different from a material in the first substrate.

19. The image sensor as in claim 10, wherein the buried light shield comprises a silicon-on-insulator layer.

20. The image sensor as in claim 10, further comprising a carrier wafer attached to the second substrate.

* * * * *